United States Patent
Jo et al.

(10) Patent No.: US 11,756,592 B2
(45) Date of Patent: Sep. 12, 2023

(54) MEMORY DEVICE SUPPORTING DBI INTERFACE AND OPERATING METHOD OF MEMORY DEVICE

(71) Applicant: SAMSUNG ELECTRONICS CO., LTD., Suwon-si (KR)

(72) Inventors: Youngmin Jo, Hwaseong-si (KR); Byunghoon Jeong, Hwaseong-si (KR); Tongsung Kim, Suwon-si (KR); Chiweon Yoon, Seoul (KR); Seonkyoo Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 70 days.

(21) Appl. No.: 17/477,931

(22) Filed: Sep. 17, 2021

(65) Prior Publication Data

US 2022/0101895 A1    Mar. 31, 2022

(30) Foreign Application Priority Data

Sep. 29, 2020  (KR) .......................... 10-2020-0127525
Feb. 9, 2021   (KR) .......................... 10-2021-0018531

(51) Int. Cl.
*G11C 7/10*       (2006.01)

(52) U.S. Cl.
CPC .......... *G11C 7/1048* (2013.01); *G11C 7/109* (2013.01); *G11C 7/1039* (2013.01); *G11C 7/1057* (2013.01); *G11C 7/1063* (2013.01); *G11C 7/1084* (2013.01)

(58) Field of Classification Search
CPC ... G11C 7/1048; G11C 7/1039; G11C 7/1057; G11C 7/1063; G11C 7/1084; G11C 7/109
See application file for complete search history.

(56) References Cited

U.S. PATENT DOCUMENTS

| | | | |
|---|---|---|---|
| 7,269,699 B2 | 9/2007 | Jang | |
| 8,706,958 B2 | 4/2014 | Hein | |
| 8,832,391 B2 | 9/2014 | Choi | |
| 9,070,467 B2* | 6/2015 | Kim | .................... G11C 11/1675 |
| 9,659,609 B2 | 5/2017 | Hong | |
| 9,798,693 B2 | 10/2017 | Hollis | |
| 10,387,075 B2 | 8/2019 | Best | |
| 10,482,961 B2* | 11/2019 | Jeong | ................. G11C 13/0023 |

(Continued)

OTHER PUBLICATIONS

EESR dated Feb. 24, 2022 in corresponding EP Patent Application No. 21198677.3.

*Primary Examiner* — Son L Mai

(74) *Attorney, Agent, or Firm* — F. Chau & Associates, LLC

(57) ABSTRACT

A memory device includes a memory cell array, a page buffer, a control logic circuit, a plurality of input/output pins, a data bus inversion (DBI) pin, and an interface circuit. The page buffer is connected to the memory cell array. The control logic circuit is configured to control an operation of the memory cell array. The plurality of input/output pins receive a plurality of data signals from the controller. The DBI pin receives a DBI signal from the controller. The interface circuit count a first number of bits having a logic value of 1 and a second number of bits having a logic value of 0 from the data signals and the DBI signal and provide the data signals to the page buffer or the control logic circuit based on the first number and the second number.

20 Claims, 20 Drawing Sheets

(56) References Cited

U.S. PATENT DOCUMENTS

| | | | |
|---|---|---|---|
| 10,529,421 B2* | 1/2020 | Jeong | G11C 13/004 |
| 10,593,382 B2* | 3/2020 | Kang | G06F 3/0653 |
| 2007/0242508 A1 | 10/2007 | Bae | |
| 2010/0259426 A1 | 10/2010 | Bae et al. | |
| 2013/0339641 A1 | 12/2013 | Ok et al. | |
| 2021/0004347 A1* | 1/2021 | Lanka | G06F 13/423 |
| 2021/0304802 A1* | 9/2021 | Lee | G11C 7/02 |

* cited by examiner

FIG. 3

| ORIGINAL DQ[7:0] | DBI | CONVERTED DQ[7:0] | # of '1' including DBI | |
|---|---|---|---|---|
| | | | Before DBI | After DBI |
| 0000 0000 | 0 | 0000 0000 | 0 | 0 |
| 0000 0001 | 0 | 0000 0001 | 1 | 1 |
| 0000 0011 | 0 | 0000 0011 | 2 | 2 |
| 0000 0111 | 0 | 0000 0111 | 3 | 3 |
| 0000 1111 | 0 | 0000 1111 | 4 | 4 |
| 0001 1111 | 1 | 1110 0000 | 5 | 4 |
| 0011 1111 | 1 | 1100 0000 | 6 | 3 |
| 0111 1111 | 1 | 1000 0000 | 7 | 2 |
| 1111 1111 | 1 | 0000 0000 | 8 | 1 |

FIG. 7

| REGION | DQ[7:0] | DBI | |
|---|---|---|---|
| DATA REGION | 0000 0000 | 0 | |
| | 0000 0001 | 0 | ~63 |
| | ... | | |
| | 0000 1111 | 0 | |
| CMD/ADDR REGION | 0001 1111 | 0 | |
| | ... | | ~62 |
| | 1111 1111 | 0 | |
| | 1111 1111 | 1 | |
| | 1111 1110 | 1 | |
| | ... | | ~65 |
| | 1111 0000 | 1 | |
| DATA REGION | 1110 0000 | 1 | |
| | ... | | ~64 |
| | 0000 0000 | 1 | |

FIG. 9

| DBI Disable | |
|---|---|
| DQ[7:0] | DBI |
| 0000 0000 | 0 |
| 0000 0001 | 0 |
| ... | |
| 0000 1111 | 0 |
| 0001 1111 | 0 |
| ... | |
| 1111 1111 | 0 |

| DBI Enable | |
|---|---|
| DQ[7:0] | DBI |
| 0000 0000 | 0 |
| 0000 0001 | 0 |
| ... | |
| 0000 1111 | 0 |
| 1110 0000 | 1 |
| ... | |
| 0000 0000 | 1 |

FIG. 10

| REGION | DQ[7:0] | DBI | |
|---|---|---|---|
| DATA REGION | 0000 0000 | 0 | |
| | 0000 0001 | 0 | ─ 91 |
| | ... | | |
| | 0000 1111 | 0 | |
| | 0001 1111 | 0 | |
| | ... | | ─ 92 |
| | 1111 1111 | 0 | |
| CMD/ADDR REGION | 1111 1111 | 1 | |
| | 1111 1110 | 1 | ─ 95 |
| | ... | | |
| | 1111 0000 | 1 | |
| | 1110 0000 | 1 | |
| | ... | | ─ 94 |
| | 0000 0000 | 1 | |

FIG. 15

|  | DQ[7:2] | DQ[1:0] |
|---|---|---|
| CMD HEADER | 111111 | XX |
| DATA HEADER | 101111 | XX |
| ADDR HEADER | 011111 | XX |

MEMORY DEVICE SUPPORTING DBI INTERFACE AND OPERATING METHOD OF MEMORY DEVICE

CROSS-REFERENCE TO RELATED APPLICATION

This U.S. non-provisional Patent application claims priority under 35 U.S.C. § 119 to Korean Patent Application No. 10-2020-0127525, filed on Sep. 29, 2020, and Korean Patent Application No. 10-2021-0018531, filed on Feb. 9, 2021, in the Korean Intellectual Property Office, the disclosures of which are incorporated by reference in their entirety herein.

1. TECHNICAL FIELD

The inventive concept relates to a memory device, and more particularly, to a memory device supporting a data bus inversion (DBI) interface and an operating method of the memory device.

2. DISCUSSION I/F RELATED ART

A memory system includes a memory controller and a memory device. The memory controller and memory device exchange data with one another through a plurality of data signal lines. The memory controller and the memory device may communicate with one another using a DBI interface to reduce power consumption. One of the memory controller and the memory device may act as a transmitting device and the other may act as a receiving device. The transmitting device may generate transmission data by using a DBI encoding method, transmit the transmission data to the receiving device, and transmit a DBI signal together with the transmission data to the receiving device. The receiving device may decode the transmission data using the DBI signal.

SUMMARY

At least one embodiment of the inventive concept provides a memory device and an operating method of the memory device capable of increasing data transmission efficiency while reducing power consumption for data transmission and memory chip size.

According to an embodiment of the inventive concept, there is provided a memory device including a memory cell array, a page buffer, a control logic circuit, a plurality of input/output pins, a data bus inversion (DBI) pin, and an interface circuit. The memory cell array includes a plurality of memory cells. The page buffer is connected to the memory cell array. The control logic circuit is configured to control an operation of the memory cell array. The plurality of input/output pins are configured to respectively receive a plurality of data signals from a controller. The data bus inversion (DBI) pin is configured to receive a DBI signal from the controller. The interface circuit is configured to count a first number of bits having a logic value of 1 and a second number of bits having a logic value of 0 from the plurality of data signals and the DBI signal and provide the plurality of data signals to the page buffer or the control logic circuit based on the first number and the second number.

According to an embodiment of the inventive concept, there is provided a memory device including a plurality of memory chips configured to receive a packet including a header and a data region from a controller. Each of the memory chips include a plurality of input/output pads, a data bus inversion (DBI) pad configure to receive a DBI signal from the controller, and an interface circuit. The input/output pads are configured to respectively receive a plurality of data signals from the controller. The DBI pad is configured to receive a DBI signal from the controller. The interface circuit is configured to count a first number of bits having a logic value of 1 and a second number of bits having a logic value of 0 from the plurality of data signals and the DBI signal and determine the plurality of data signals as the header or the data region based on the first number and the second number.

According to an embodiment of the inventive concept, there is provided a memory device including a memory cell array, a page buffer, a control logic circuit, a plurality of input/output pins, a data bus inversion (DBI) pin, and an interface circuit. The memory device is configured to receive a packet including a header and a data region from a controller. The memory cell array includes a plurality of memory cells. The page buffer is connected to the memory cell array. The control logic circuit is configured to control an operation of the memory cell array. The input/output pins are configured to respectively receive a plurality of data signals from the controller. The DBI pin is configured to receive a DBI signal from the controller. The interface circuit is configured to count a first number of bits having a logic value of 1 and a second number of bits having a logic value of 0 from the plurality of data signals and the DBI signal, determine the plurality of data signals as the header or the data region based on the first number and the second number, determine the data region as data, a command, or an address based on bits included in the header, provide the data to the page buffer, and provide the command or the address to the control logic circuit.

According to an embodiment of the inventive concept, there is provided a memory device including a plurality of memory chips. Each of the plurality of memory chips includes a memory cell array, a plurality of input/output pads, a data bus inversion (DBI) pad, and an interface circuit. The memory device is configured to receive a packet including a header and a data region from a controller. The memory cell array includes a plurality of memory cells. The input/output pads are configured to respectively receive a plurality of data signals from the controller. The DBI pad is configured to receive a DBI signal from the controller. The interface circuit is configured to count a first number of bits having a logic value of 1 and a second number of bits having a logic value of 0 from the plurality of data signals and the DBI signal, determine the plurality of data signals as the header or the data region based on the first number and the second number, determine a selected memory chip from among the memory chips based on bits included in the header.

BRIEF DESCRIPTION I/F THE DRAWINGS

Embodiments of the inventive concept will be more clearly understood from the following detailed description taken in conjunction with the accompanying drawings in which:

FIG. 3 is a table showing a data signal according to a DBI interface according to an embodiment of the inventive concept;

FIG. 7 is a table showing signals corresponding to a data region and signals corresponding to command/address regions according to an embodiment of the inventive concept;

FIG. 9 is a table showing a plurality of data signals and DBI signals according to an embodiment of the inventive concept;

FIG. 10 is a table showing signals corresponding to a data region and signals corresponding to command/address regions according to an embodiment of the inventive concept;

FIG. 15 is a table showing a command header, a data header, and an address header according to an embodiment of the inventive concept;

DETAILED DESCRIPTION I/F THE EMBODIMENTS

Figure 1:
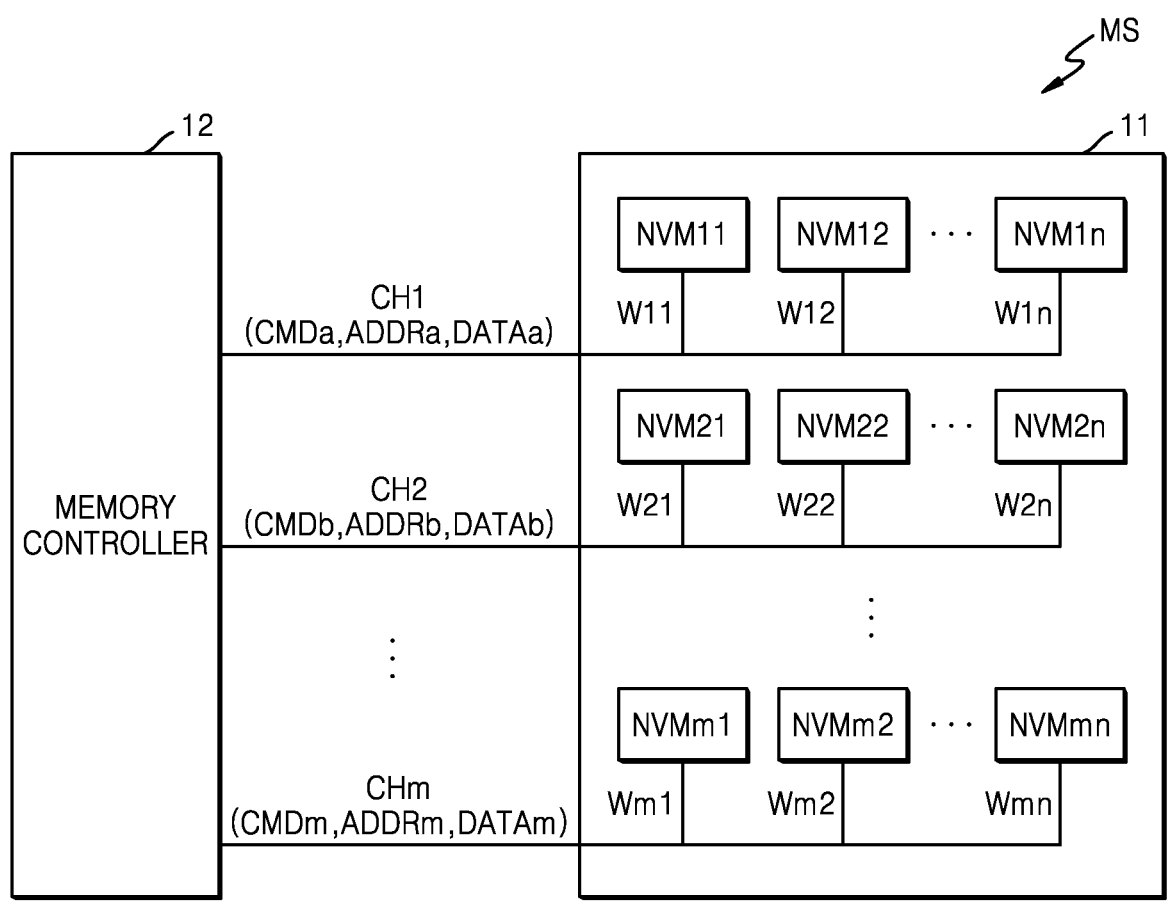
FIG. 1 is a block diagram showing a memory system according to an embodiment of the inventive concept.

FIG. 1 is a block diagram showing a memory system MS according to an embodiment of the inventive concept.

Referring to FIG. 1, the memory system MS may include a memory device 11 and a memory controller 12 (e.g., a control circuit). The memory system MS may support a plurality of channels CH1 to CHm, and the memory controller 12 may be connected to the memory device 11 through the channels CH1 to CHm. For example, the memory system MS may be implemented as a storage device like a solid state drive (SSD). In the present specification, the term "controller" may indicate a "memory controller".

The memory device 11 may include a plurality of non-volatile memories NVM11 to NVMmn. The non-volatile memories NVM11 to NVMmn may each be connected to one of the channels CH1 to CHm through a corresponding way. For example, non-volatile memories NVM11 to NVM1$n$ may be connected to a first channel CH1 through ways W11 to W1$n$, and non-volatile memories NVM21 to NVM2$n$ may be connected to a second channel CH2 through ways W21 to W2$n$. In an example embodiment, the non-volatile memories NVM11 to NVMmn may each be implemented as an arbitrary memory unit capable of operating according to an individual command from the memory controller 12. For example, the non-volatile memories NVM11 to NVMmn may each be implemented as a chip or a die, but the inventive concept is not limited thereto.

The memory controller 12 may exchange signals with the memory device 11 through the channels CH1 to CHm. For example, the memory controller 12 may transmit commands CMDa to CMDm, addresses ADDRa to ADDRm, and data DATAa to DATAm to the memory device 11 or receive the data DATAa to DATAm from the memory device 11, through the channels CH1 to CHm.

Through each channel, the memory controller 12 may select one from among the non-volatile memories NVM11 to NVMmn connected to a corresponding channel and transmit and receive signals with a selected non-volatile memory. For example, the memory controller 12 may select a non-volatile memory NVM11 from among the non-volatile memories NVM11 to NVM1$n$ connected to the first channel CH1. The memory controller 12 may transmit a command CMDa, an address ADDRa, and data DATAa to the selected non-volatile memory NVM11 or receive the data DATAa from the selected non-volatile memory NVM11, through the first channel CH1.

The memory controller 12 may transmit and receive signals to and from the memory device 11 in parallel through different channels. For example, the memory controller 12 may transmit a command CMDb to the memory device 11 through the second channel CH2 while the command CMDa is being transmitted to the memory device 11 through the first channel CH1. For example, the memory controller 12 may receive data DATAb from the memory device 11 through the second channel CH2 while the data DATAa is being received from the memory device 11 through the first channel CH1.

The memory controller 12 may control an overall operation of the memory device 11. The memory controller 12 may control each of the non-volatile memories NVM11 to NVMmn connected to the channels CH1 to CHm by transmitting signals through the channels CH1 to CHm. For example, the memory controller 12 may control one selected from among the non-volatile memories NVM11 to NVM1$n$ by transmitting the command CMDa and the address ADDRa through the first channel CH1.

The non-volatile memories NVM11 to NVMmn may each operate under the control of the memory controller 12. For example, the non-volatile memory NVM11 may program the data DATAa according to the command CMDa and the address ADDRa provided through the first channel CH1. For example, a non-volatile memory NVM21 may read the data DATAb according to the command CMDb and the address ADDRb provided through the second channel CH2 and transmit the read data DATAb to the memory controller 12.

Although FIG. 1 shows that the memory device 11 communicates with the memory controller 12 through m channels and the memory device 11 includes n non-volatile memories in correspondence to each channel, the number of channels and the number of non-volatile memories connected to one channel may vary.

For example, in the case of performing a read operation on the non-volatile memory NVM11, when the memory controller 12 transmits a page read command through the first channel CH1, the non-volatile memory NVM11 generates read data during a read time tR. Next, when the memory controller 12 transmits a random read command through the first channel CH1, the non-volatile memory NVM11 transmits the read data to the memory controller 12 through the first channel CH1. At this time, a transmission time for the random read command may be defined as tCMD, and a transmission time for the read data may be defined as tDMA.

In an embodiment, a way interleaving operation may be performed to improve input/output (I/O) efficiency. For example, the memory controller 12 may sequentially transmit page read commands to the non-volatile memories NVM11 to NVM1$n$ connected to the first channel CH1, thereby overlapping read data generation times of the non-volatile memories NVM11 to NVM1$n$. When a read data generation operation of a first non-volatile memory from among the non-volatile memories NVM11 to NVM1$n$ ends, the memory controller 12 may transmit a random read command through the first channel CH1 and receive read data from the first non-volatile memory. Next, the memory controller 12 may transmit a random read command through the first channel CH1 and receive read data from a next non-volatile memory. At this time, in the case of a data read operation for N non-volatile memories, the I/O efficiency may be expressed as Equation 1 below.

$$I/O \text{ Efficiency} = \frac{N \cdot tDMA}{N \cdot tCMD + N \cdot tDMA} \times 100 \quad \text{[Equation 1]}$$

While tDMA decreases as the bandwidth between the memory controller 12 and the memory device 11 increases, the decrease in tCMD is relatively insignificant due to a command overhead due to a time parameter at the time of command transmission or a time parameter at the time of address transmission. As a result, despite an increased bandwidth, I/O efficiency may deteriorate. Therefore, various embodiments for improving I/O efficiency by reducing tCMD and various embodiments for improving I/O efficiency through overlapping of tCMD and tDMA according to the inventive concept will be described below.

To reduce power consumption for data transmission/reception between the memory device 11 and the memory controller 12, the memory device 11 and the memory controller 12 may transmit and receive data by using a DBI interface using a DBI signal. For example, the memory controller 12 may generate transmission data by selectively inverting at least some bits of data by using the DBI encoding method and transmit a DBI signal indicating that the at least some bits of the data are inverted together with the transmission data to the memory device 11. When the memory system MS supports the channels CH1 to CHm, the memory controller 12 may generate a plurality of DBI signals respectively corresponding to the channels CH1 to CHm. In the same regard, the memory device 11 may generate transmission data by selectively inverting at least some bits of data by using the DBI encoding method and transmit a DBI signal indicating that the at least some bits of the data are inverted together with the transmission data to the memory controller 12.

According to an embodiment of the inventive concept, a data region and a command region are each defined by using a DBI signal in a DBI interface, and thus tCMD may be reduced by reducing command overhead. Also, according to at least one embodiment of the inventive concept, when performing packet type communication in a DBI interface, a header/trailer and a data region may be distinguished by using a DBI signal, and the data region may be determined as a command, an address, or data by using information included in a header, and thus tCMD and tDMA may be overlapped. The trailer may also be referred to as a tail.

Figure 2:
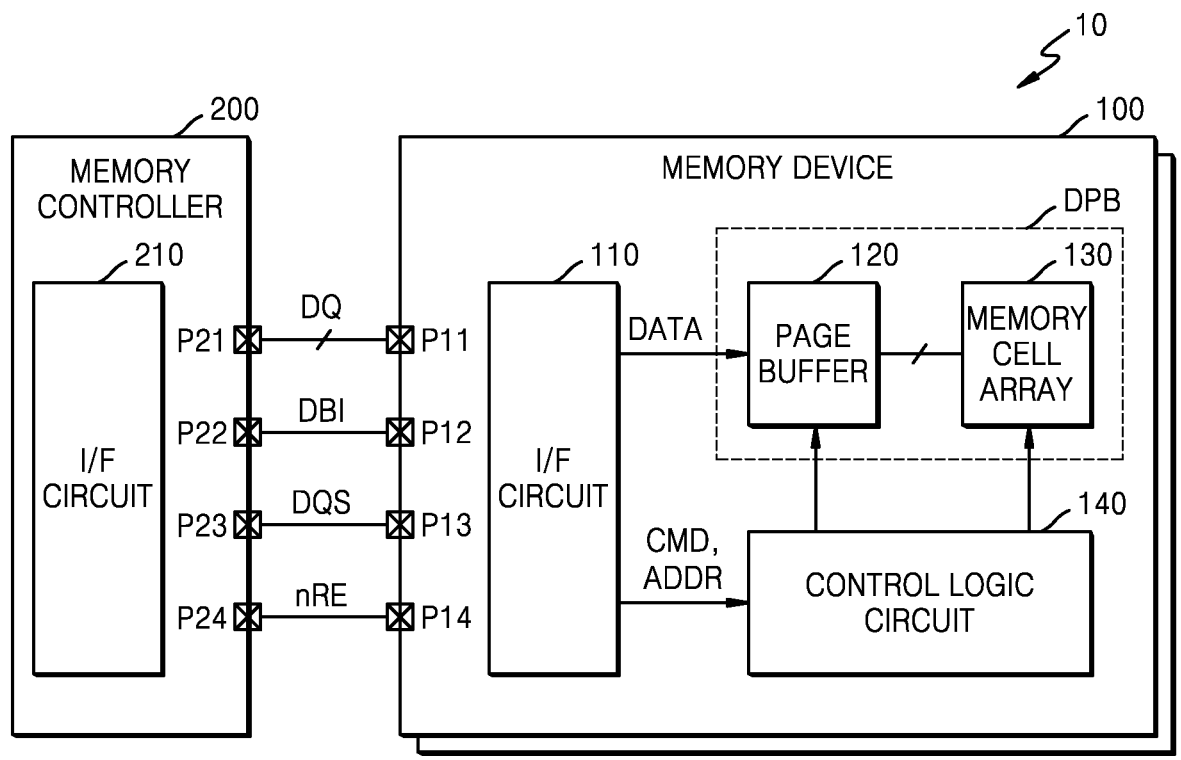
FIG. 2 is a schematic block diagram showing a memory system according to an embodiment of the inventive concept.

FIG. 2 is a schematic block diagram showing a memory system 10 according to an embodiment of the inventive concept.

Referring to FIG. 2, the memory system 10 includes a memory device 100 and a memory controller 200. The memory device 100 may correspond to one from among the non-volatile memories NVM11 to NVMmn communicating with the memory controller 12 using one channel from among the channels CH1 to CHm of FIG. 1. The memory controller 200 may correspond to the memory controller 12 of FIG. 1.

The memory device 100 may include first to fourth pins P11 to P14, an interface (I/F) circuit 110, a page buffer 120, a memory cell array 130, and a control logic circuit 140. In the present specification, the page buffer 120 and the memory cell array 130 may be referred to as a data path block DPB. In some embodiments, the data path block DPB may further include a data I/O circuit. However, embodiments of the inventive concept are not limited thereto. For example, in some embodiments, the data I/O circuit may be included in the I/F circuit 110.

The I/F circuit 110 may receive a plurality of data signals DQ from the memory controller 200 or transmit the data signals DQ to the memory controller 200, through first pins P11. Commands CMD, addresses ADDR, and data DATA may be transmitted through the data signals DQ. For example, the data signals DQ may be transmitted through a plurality of data signal lines, respectively, and the plurality of data signal lines may constitute one of the channels CH1 to CHm of FIG. 1. According to embodiments, the data signals DQ may be a plurality of input/output signals and the plurality of input/output signals may be referred to as a plurality of data input/output signals. Hereinafter, descriptions will be given based on an embodiment in which the number of the first pins P11 is 8. However, embodiments of the inventive concept are not limited thereto. For example, the number of the first pins P11 may vary according to embodiments.

The I/F circuit 110 may receive a DBI signal DBI from the memory controller 200 or transmit the DBI signal DBI to the memory controller 200 through a second pin P12. For example, the DBI signal DBI may be a 1-bit signal. However, embodiments of the inventive concept are not limited thereto. For example, the DBI signal DBI may be a multi-bit signal. In this case, the second pin P12 may be implemented by a plurality of pins. During an operation of the memory device 100 for inputting data DATA, the I/F circuit 110 may receive a plurality of data signals DQ through the first pins P11 and a DBI signal DBI through the second pins P12. During an operation of the memory device 100 for outputting the data DATA, the I/F circuit 110 may transmit a plurality of data signals DQ through the first pins P11 and a DBI signal DBI through the second pins P12. Detailed descriptions of transmission and reception of the DBI signal DBI and the data signals DQ will be given later with reference to FIG. 3.

The I/F circuit 110 may receive a data strobe signal DQS from the memory controller 200 or transmit the data strobe signal DQS to the memory controller 200 through a third pin P13. The I/F circuit 110 may receive a read enable signal nRE from the memory controller 200 through a fourth pin P14.

During the operation of the memory device 100 for outputting the data DATA, the I/F circuit 110 may receive the read enable signal nRE toggled through the fourth pin P14 before outputting the data DATA. The I/F circuit 110 may generate a data strobe signal DQS toggled based on toggling of the read enable signal nRE. For example, the I/F circuit 110 may generate a data strobe signal DQS that starts to be toggled after a predetermined delay (e.g., tDQSRE) based on a toggling start time of the read enable signal nRE. The I/F circuit 110 may transmit a plurality of data signals DQ including the data DATA based on a toggle timing of the data strobe signal DQS. Therefore, the data DATA may be aligned to the toggle timing of the data strobe signal DQS and transmitted to the memory controller 200.

During the operation of the memory device 100 for inputting the data DATA, when a plurality of data signals DQ including the data DATA are received from the memory controller 200, the I/F circuit 110 may receive a data strobe signal DQS to be toggled together with data DATA from the memory controller 200. The I/F circuit 110 may obtain the data DATA from the data signals DQ based on a toggle timing of the data strobe signal DQS. For example, the I/F circuit 110 may obtain the data DATA by sampling the data signals DQ at a rising edge and a falling edge of the data strobe signal DQS.

In some embodiments, the memory device 100 may further include a pin for receiving a chip enable signal nCE from the memory controller 200. The I/F circuit 110 may exchange signals with the memory controller 200 through the first to fourth pins P11 to P14 according to the chip enable signal nCE. For example, when the chip enable signal nCE is in an enabled state (e.g., low level), the I/F circuit 110 may exchange signals with the memory controller 200 through the first to fourth pins P11 to P14.

In some embodiments, the memory device 100 may further include a pin that outputs a ready/busy output signal nR/B. The I/F circuit 110 may transmit status information regarding the memory device 100 to the memory controller 200 through the ready/busy output signal nR/B. When the memory device 100 is in a busy state (i.e., when internal operations of the memory device 100 are being performed), the I/F circuit 110 may transmit the ready/busy output signal nR/B indicating the busy state to the memory controller 200. When the memory device 100 is in a ready state (i.e., when internal operations of the memory device 100 are not performed or are completed), the I/F circuit 110 may transmit the ready/busy output signal nR/B indicating the ready state to the memory controller 200. For example, while the memory device 100 is reading the data DATA from the memory cell array 130 in response to a page read command, the I/F circuit 110 may transmit the ready/busy output signal nR/B indicating the busy state (e.g., low level) to the memory controller 200. For example, while the memory device 100 is programming the data DATA to the memory cell array 130 in response to a program command, the I/F circuit 110 may transmit the ready/busy output signal nR/B indicating the busy state to the memory controller 200.

The control logic circuit 140 may control various operations of the memory device 100. The control logic circuit 140 may receive a command CMD and an address ADDR obtained from the I/F circuit 110. The control logic circuit 140 may generate control signals for controlling other components of the memory device 100 according to the command CMD and the address ADDR. For example, the control logic circuit 140 may generate various control signals to program the data DATA to the memory cell array 130 or read the data DATA from the memory cell array 130.

The page buffer 120 may receive the data DATA from the I/F circuit 110. The page buffer 120 may be used as a write driver for writing data to the memory cell array 130 under the control of the control logic circuit 140. Also, the page buffer 120 may be used as a sense amplifier for receiving data from the memory cell array 130 under the control of the control logic circuit 140. The memory cell array 130 may store the data DATA obtained from the page buffer 120 under the control of the control logic circuit 140. The memory cell array 130 may output the data DATA stored under the control of the control logic circuit 140 to the page buffer 120.

The memory cell array 130 may include a plurality of memory cells. For example, the memory cells may be flash memory cells. However, embodiments of the inventive concept are not limited thereto. For example, the memory cells may include resistive random access memory (RRAM) cells, ferroelectric random access memory (FRAM) cells, phase change random access memory (PRAM) cells, thyristor random access memory (TRAM) cells, or magnetic random access memory (MRAM) cells. Hereinafter, embodiments of the inventive concept will be described based on embodiments in which the memory cells are NAND flash memory cells.

In an embodiment, the I/F circuit 110 counts a first number of bits having a logic value of 1 and a second number of bits having a logic value of 0 from among a plurality of data signals DQ received through the first pins P11 and a DBI signal received through the second pin P12 and provides the data signals DQ to the data path block DPB or the control logic circuit 140 based on the counted first number and the counted second number. For example, when the first number is less than or equal to the second number, the I/F circuit 110 may determine that the data signals DQ include the data DATA and provide the data signals DQ to the data path block DPB. For example, when the first number is greater than the second number, the I/F circuit 110 may determine that the data signals DQ includes a command CMD or an address ADDR and provide the data signals DQ to the control logic circuit 140.

According to a present embodiment, the memory device 100 supporting a DBI interface determines a plurality of data signals DQ as commands CMD, addresses ADDR, or data DATA based on a first number of bits having a logic value of 1 and a second number of bits having a logic value of 0 included in the data signals DQ and DBI signal DBI. Therefore, since the memory device 100 does not need to receive a flag signal indicating that the data signals DQ are commands CMD, e.g., a command latch enable signal CLE, from the memory controller 200, the memory device 100 need not include a pin for receiving the command latch enable signal CLE. Also, since the memory device 100 does not need to receive a flag signal indicating that the data signals DQ are addresses ADDR, e.g., an address latch enable signal ALE, from the memory controller 200, the memory device 100 need not include a pin or a pad for receiving the address latch enable signal ALE. Furthermore, since the memory device 100 does not need to receive a clock signal for distinguishing a command CMD, an address ADDR, and data DATA, e.g., a write enable signal nWE, the memory device 100 need not include a pin or a pad for receiving the write enable signal nWE. As a result, since the memory device 100 may include fewer pins or pads, a chip size may be reduced.

Also, since the memory device 100 may determine a plurality of data signals DQ received through the first pins P11 as commands, addresses, or data without receiving a command latch enable signal CLE and an address latch enable signal ALE, an overhead occurring in an enable period of the command latch enable signal CLE and an overhead occurring in an enable period of the address latch enable signal ALE may be removed, and an overhead occurring after the address latch enable signal ALE transitions to a disable period may also be removed. As a result, since the memory device 100 may reduce tCMD as compared to an existing memory device, I/O efficiency may be significantly improved.

In an embodiment, the memory device 100 and the memory controller 200 exchange packets with one another including a header, a data region, and a trailer. The I/F circuit 110 may count a first number of bits having a logic value of 1 and a second number of bits having a logic value of 0 from a plurality of data signals DQ received through the first pins P11 and a DBI signal received through the second pin P12 and determine the data signals DQ as a header, a data region, or a trailer based on the counted first number and the counted second number. More detailed descriptions thereof will be given later with reference to FIGS. 13 to 19.

The memory controller 200 may include first to fourth pins P21 to P24 and an I/F circuit 210. The first to fourth pins P21 to P24 may correspond to the first to fourth pins P11 to P14 of the memory device 100, respectively. The I/F circuit 210 may transmit data signals DQ to the memory device 100 or receive data signals DQ from the memory device 100 through first pins P21. The I/F circuit 210 may transmit a DBI signal DBI to the memory device 100 or receive a DBI signal DBI from the memory device 100 through a second pin P22. The I/F circuit 210 may receive a data strobe signal DQS from the memory device 100 or transmit a data strobe signal DQS to the memory device 100 through a third pin P23. The I/F circuit 210 may transmit a read enable signal nRE to the memory device 100 through a fourth pin P24.

During an operation of the memory device 100 for outputting the data DATA, the I/F circuit 210 may generate a read enable signal nRE to be toggled and transmit the read enable signal nRE to the memory device 100. For example, the I/F circuit 210 may generate a read enable signal nRE that is changes from a fixed state (e.g., a high level or a low level) to a toggled state before the data DATA is output. Therefore, a data strobe signal DQS to be toggled based on a read enable signal nRE may be generated in the memory device 100. The I/F circuit 210 may receive data signals DQ including data DATA together with the data strobe signal DQS to be toggled from the memory device 100. The I/F circuit 210 may obtain the data DATA from the data signals DQ based on a toggle timing of the data strobe signal DQS.

During an operation of the memory device 100 for inputting the data DATA, the I/F circuit 210 may generate a data strobe signal DQS to be toggled. For example, the I/F circuit 210 may generate a data strobe signal DQS that is changes from a fixed state (e.g., a high level or a low level) to a toggled state before the data DATA is transmitted. The I/F circuit 210 may transmit the data signals DQ including the data DATA based on a toggle timing of the data strobe signal DQS to the memory device 100.

In some embodiments, the memory controller 200 may further include a pin for transmitting a chip enable signal nCE to the memory device 100. The I/F circuit 210 may exchange signals with a memory device 100 selected by a chip enable signal nCE through the first to fourth pins P21 to P24. In some embodiments, the memory controller 200 may further include a pin for receiving a ready/busy output signal nR/B from the memory device 100. The I/F circuit 210 may determine status information regarding the memory device 100 based on the ready/busy output signal nR/B.

FIG. 3 is a table showing a data signal according to a DBI interface according to an embodiment of the inventive concept.

Referring to FIGS. 2 and 3 together, for example, the number of the first pins P11 may be 8 and the number of the second pin P12 may be 1. However, embodiments of the inventive concept are not limited thereto. For example, the number of the first pins P11 may vary and the number of second pins P12 may also vary. The memory controller 200 may transmit an 8-bit data signal DQ[7:0] and an 1-bit DBI signal DBI to the memory device 100. Also, the memory device 100 may transmit an 8-bit data signal DQ[7:0] and an 1-bit DBI signal DBI to the memory controller 200.

A channel may include a plurality of signal lines, e.g., 8 data signal lines. When a data signal corresponding to bit 1 is transmitted through a data signal line, a direct current (DC) current may be relatively large. When a data signal corresponding to bit 0 is transmitted through the data signal line, the DC current may be relatively small. Therefore, to reduce a DC current of a channel, the number of bits having a logic value of 1 may be less than the number of bits having a logic value of 0 in data signals respectively transmitted through a plurality of signal lines.

When the number of bits having a logic value of 1 in an original data signal is not greater than the number of bits having a logic value of 0, a DBI signal DBI may be generated as a disable level signal, that is, bit 0. In this case, bits included in the original data signal are not converted, and the original data signal is transmitted through the data signal lines. For example, when the original data signal is 00000001, the DBI signal DBI is generated as bit 0, a converted data signal generated as a result of DBI encoding is the same as the original data signal, and a converted data signal 00000001 and the DBI signal DBI are transmitted. In this case, the total number of bits having a logic value of 1 included in the data signal and the DBI signal DBI is 1, and the total number of bits having a logic value of 1 is the same before and after the DBI encoding.

On the other hand, when the number of bits having a logic value of 1 in an original data signal is greater than the number of bits having a logic value of 0, a DBI signal DBI may be generated as an enable level signal, that is, bit 1. In this case, bits included in the original data signal are converted or inverted to generate a converted data signal, and the converted data signal is transmitted through the data signal lines. For example, when the original data signal is 00011111, the DBI signal DBI is generated as bit 1, a converted data signal 11100000 is generated as a result of DBI encoding, and a converted data signal 11100000 and the DBI signal DBI are transmitted. In this case, the total number of bits having a logic value of 1 included in the data signal and the DBI signal DBI is 4, and the total number of bits having a logic value of 1 is decreased as compared to that before the DBI encoding. Therefore, power consumption for data transmission may be reduced.

Figure 4:
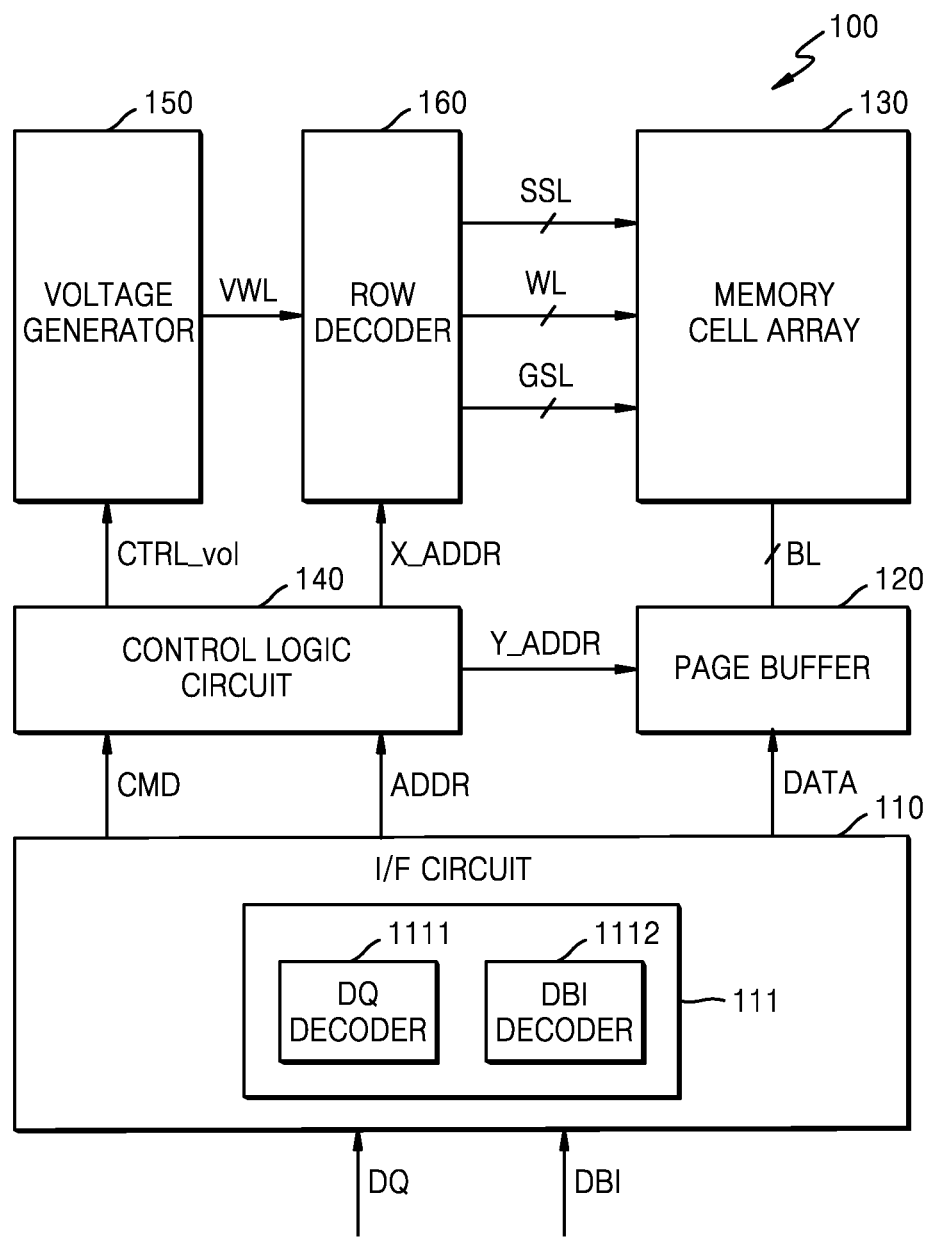
FIG. 4 is a block diagram showing a memory device according to an embodiment of the inventive concept in detail.

FIG. 4 is a block diagram showing the memory device 100 according to an embodiment of the inventive concept in detail.

Referring to FIGS. 2 and 4 together, the memory device 100 include the I/F circuit 110, the page buffer 120, the memory cell array 130, the control logic circuit 140, a voltage generator 150, and a row decoder 160 (e.g., a decoder circuit). The I/F circuit 110 may receive a plurality of data signals DQ from the memory controller 200 through the first pins P11, respectively, and may receive a DBI signal DBI from the memory controller 200 through the second pin P12. The I/F circuit 110 may include a decoder 111 (e.g., a decoder circuit), and the decoder 111 may include a data signal decoder 1111 and a DBI decoder 1112.

The data signal decoder 1111 may count the first number of bits having a logic value of 1 and the second number of bits having a logic value of 0 from the data signals DQ and the DBI signal DBI and determine a transmission path for the data signals DQ based on the counted first number and the counted second number. For example, when the data signal decoder 1111 determines that the data signals DQ include a command CMD or an address ADDR, the data signal decoder 1111 may provide the command CMD or the address ADDR to the control logic circuit 140. For example, when the data signal decoder 1111 determines that the data signals DQ includes data DATA, the data signal decoder 1111 may provide the data DATA to the DBI decoder 1112 or the page buffer 120.

The DBI decoder 1112 may generate decoded data signals by performing DBI decoding on the data signals DQ based on the DBI signal DBI. For example, the DBI decoder 1112 may generate decoded data DATA by performing DBI decoding on data included in the data signals DQ based on the DBI signal DBI and provide the decoded data DATA to the page buffer 120.

The control logic circuit 140 may control various operations inside the memory device 100. The control logic circuit 140 may output various control signals in response to a command CMD and/or an address ADDR from the I/F circuit 110. For example, the control logic circuit 140 may output a voltage control signal CTRL_vol, a row address X-ADDR, and a column address Y-ADDR.

The memory cell array 130 may be connected to the page buffer 120 through bit lines BL and may be connected to the row decoder 160 through word lines WL, string select lines SSL, and ground select lines GSL. In an example embodiment, the memory cell array 130 may include a 3-dimensional memory cell array, and the 3-dimensional memory cell array may include a plurality of NAND strings. Each NAND string may include memory cells connected to word lines vertically stacked on a substrate, respectively. U.S. Pat. Nos. 7,679,133, 8,553,466, 8,654,587, 8,559,235, and U.S. Patent Application Publication No. 2011/0233648 are incorporated herein by reference. In an example embodiment, the memory cell array 130 may include a 2-dimensional memory cell array, and the 2-dimensional memory cell array may include a plurality of NAND strings arranged in row-wise directions and column-wise directions.

The page buffer 120 may select at least one bit line from among the bit lines BL in response to a column address Y_ADDR. The page buffer 120 may operate as a write driver or a sense amplifier depending on an operation mode. For example, during a program operation, the page buffer 120 may apply a bit line voltage corresponding to data to be programmed to a selected bit line. During a read operation, the page buffer 120 may sense data stored in a memory cell by sensing a current or a voltage of the selected bit line.

The voltage generator 150 may generate various types of voltages for performing a program operation, a read operation, and an erase operation based on a voltage control signal CTRL_vol. For example, the voltage generator 150 may generate a program voltage, a read voltage, a program verify voltage, or an erase voltage as a word line voltage VWL. The row decoder 160 may select one from among the word lines WL in response to a row address X_ADDR and may select one from among the string select lines SSL. For example, the row decoder 160 may apply a program voltage and a program verify voltage to a selected word line during a program operation and may apply a read voltage to a selected word line during a read operation.

Figure 5:
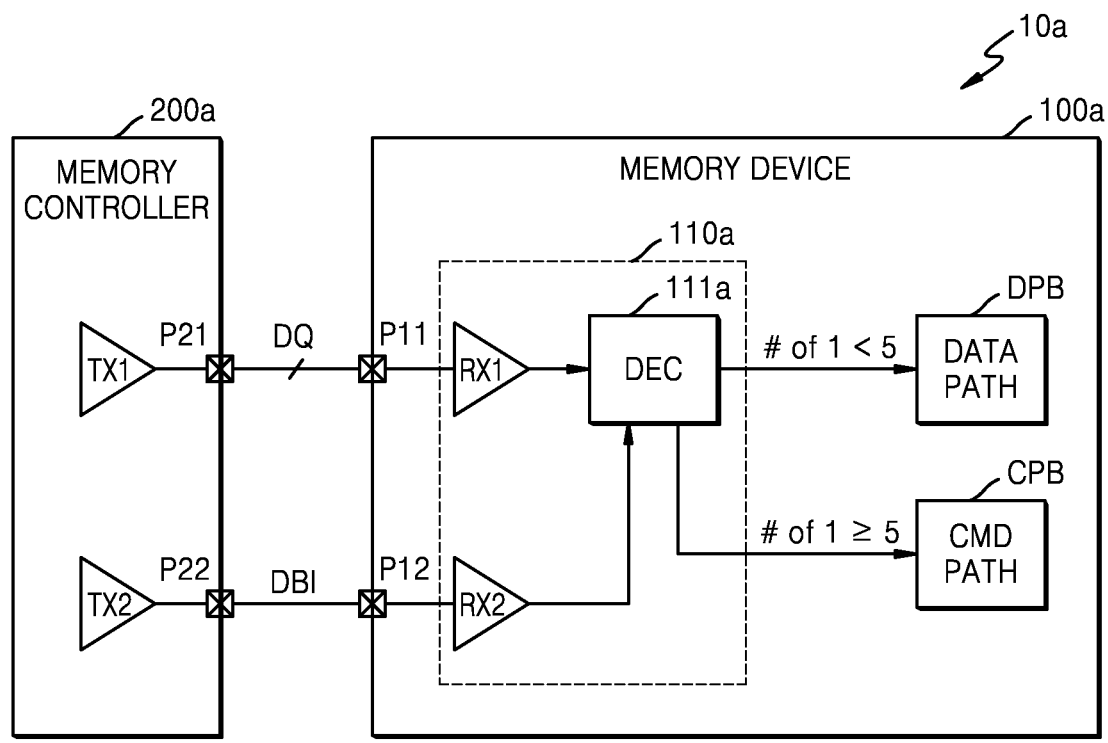
FIG. 5 is a block diagram showing a memory system according to an embodiment of the inventive concept.

FIG. 5 is a block diagram showing a memory system 10a according to an embodiment of the inventive concept.

Referring to FIG. 5, the memory system 10a includes a memory device 100a and a memory controller 200a. The memory device 100a may correspond to an implementation example of the memory device 100 of FIG. 2, and the memory controller 200a may correspond to an implementation example of the memory controller 200 of FIG. 2. Descriptions given above with reference to FIGS. 2 to 5 may be applied to the present embodiment.

The memory controller 200a includes the first pins P21, the second pin P22, data signal transmitters TX1, and a DBI signal transmitter TX2. The memory device 100a include the first pins P11, the second pin P12, an I/F circuit 110a, a data path block DPB, and a command path block CPB. For example, the data path block DPB may correspond to the page buffer 120 and the memory cell array 130 of FIG. 2, and the command path block CPB may correspond to the control logic circuit 140 of FIG. 2.

The I/F circuit 110a corresponds to an embodiment of the I/F circuit 110 of FIG. 2 and may include data signal receivers RX1, a DBI signal receiver RX2, and a decoder (DEC) 111a. The data signal receivers RX1 may provide data signals DQ respectively received from the first pins P11 to the decoder 111a. The DBI signal receiver RX2 may provide a DBI signal DBI received from the second pin P12 to the decoder 111a. However, embodiments of the inventive concept are not limited thereto. For example, the DBI signal receiver RX2 may provide a DBI signal DBI to the data path block DPB. For example, the data signal receivers RX1 and the DBI signal receiver RX2 may be implemented as input buffers. In an embodiment, the data signal receivers RX1 and the DBI signal receiver RX2 may be implemented using operational amplifiers.

Figure 6:
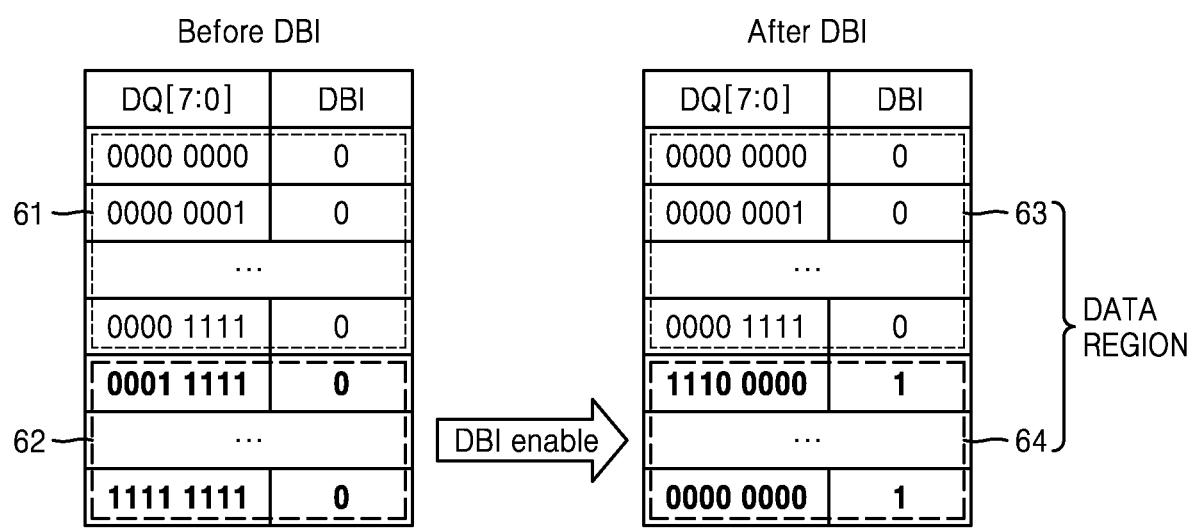
FIG. 6 is a table showing a plurality of data signals and DBI signals according to an embodiment of the inventive concept.

FIG. 6 is a table showing a plurality of data signals and DBI signals according to an embodiment of the inventive concept.

Referring to FIG. 6, before application of DBI encoding, regardless of the number of bits having a logic value of 0 or the number of bits having a logic value of 1 included in a plurality of data signals DQ[7:0], a DBI signal DBI may have a disable level, that is, a bit having a logic value of 0. A plurality of data signals DQ[7:0] and a DBI signal DBI before DBI encoding is applied may be divided into a first region 61 in which the total number of bits having a logic value of 1 is less than the total number of bits having a logic value of 0 and a second region 62 in which the total number of bits having a logic value of 1 is greater than the total number of bits having a logic value of 0.

After DBI encoding is applied, the DBI signal DBI may be selectively enabled according to the number of bits having a logic value of 0 or the number of bits having a logic value of 1 included in the data signals DQ[7:0]. Therefore, the data signals DQ[7:0] and the DBI signal DBI after application of DBI encoding may be divided into a third region 63 in which the DBI signal is at the disable level (i.e., bit has a logic value of 0) and a fourth region 64 in which the DBI signal is at the enable level (i.e., bit has a logic value of 1). In this regard, by applying DBI encoding, the first region 61 may be converted to the third region 63 and the second region 62 may be converted to the fourth region 64.

FIG. 7 is a table showing signals corresponding to a data region and signals corresponding to command/address regions according to an embodiment of the inventive concept.

Referring to FIGS. 5 to 7 together, the third region 63 and the fourth region 64 after application of DBI encoding may be used as a data region. Therefore, the I/F circuit 110a may count a first number of bits having a logic value of 1 and a second number of bits having a logic value of 0 from the data signals DQ[7:0] and the DBI signal DBI, determine that the data signals DQ[7:0] correspond to data DATA when the first number of bits having a logic value of 1 is less than or equal to the second number of bits having a logic value of 0, and provide the data DATA to the data path block DPB.

In an embodiment, the second region 62 before application of DBI encoding may be used as a command region. In an embodiment, the second region 62 before application of DBI encoding may be used as an address region. In an embodiment, the second region 62 before application of DBI encoding may be used as a command/address region. Therefore, the I/F circuit 110a may count a first number of bits having a logic value of 1 and a second number of bits has a logic value of 0 from the data signals DQ[7:0] and the DBI signal DBI, determine that the data signals DQ[7:0] correspond to a command CMD or an address ADDR when the first number of bits having a logic value of 1 is greater than the second number of bits has a logic value of 0, and provide the command CMD or the address ADDR to the command path block CPB.

In an embodiment, a fifth region 65 may be used as a command region. In an embodiment, the fifth region 65 may be used as an address region. In an embodiment, the fifth region 65 may be used as a command/address region. Therefore, the I/F circuit 110a may count a first number of bits having a logic value of 1 and a second number of bits has a logic value of 0 from the data signals DQ[7:0] and the DBI signal DBI, determine that the data signals DQ[7:0] correspond to a command CMD or an address ADDR when the first number of bits having a logic value of 1 is greater than the second number of bits has a logic value of 0, and provide the command CMD or the address ADDR to the command path block CPB.

For example, when the number of the first pins P11 is 8 and the number of the second pin P12 is 1, the decoder 111a may compare the first number of bits having a logic value of 1 with a reference number of 5. As a result of the comparison, when the first number of bits having a logic value of 1 is less than 5, it may be considered that the data signals DQ[7:0] correspond to a data region including the third region 63 and the fourth region 64, and thus decoder 111a may provide the data signals DQ[7:0] to the data path block DPB. On the other hand, as a result of the comparison, when the first number of bits having a logic value of 1 is not less than 5, it may be considered that the data signals DQ[7:0] correspond to a command/address region including the second region 62 and the fifth region 65, and thus decoder 111a may provide the data signals DQ[7:0] to the command path block CPB. In an embodiment, the memory controller 200a sends data signals DQ[7:0] having a format of the second region 62 or the fifth region 65 when the memory controller 200a is sending a command or an address to the memory device 100a, and the memory controller 200a sends data signals DQ[7:0] having a format of the third region 63 or the fourth region 64 when the memory controller 200a is sending data to the memory device 100a.

As described above, the I/F circuit 110a may count a first number of bits having a logic value of 1 and a second number of bits having a logic value of 0 from the data signals DQ[7:0] and the DBI signal DBI. However, embodiments of the inventive concept are not limited thereto. In some embodiments, the I/F circuit 110a may count a first number of bits having a logic value of 1 and a second number of bits has a logic value of 0 from the data signals DQ[7:0] and determine a transmission path for the data signals DQ based on the counted first number and the counted second number.

As described above, the I/F circuit 110a may determine that the data signals DQ[7:0] correspond to data DATA when the first number of bits having a logic value of 1 is less than or equal to a threshold value, for example, the second number of bits having a logic value of 0, and provide the data DATA to the data path block DPB. However, embodiments of the inventive concept are not limited thereto. According to some embodiments, a termination logic of the I/F circuit 110a may correspond to one of various configurations. For example, a termination resistor of the I/F circuit 110a may be connected to a power supply voltage terminal or a ground voltage terminal. Thus, in some embodiments, the I/F circuit 110a may determine that the data signals DQ[7:0] correspond to data DATA when the second number of bits having a logic value of 0 is less than or equal to a threshold value, for example, the first number of bits having a logic value of 1, and provide the data DATA to the data path block DPB.

As described above, the I/F circuit 110a may determine that the data signals DQ[7:0] correspond to a command CMD or an address ADDR when the first number of bits having a logic value of 1 is greater than a threshold value, for example, the second number of bits having a logic value of 0, and provide the command CMD or the address ADDR to the command path block CPB. However, embodiments of the inventive concept are not limited thereto. According to some embodiments, a termination logic of the I/F circuit 110a may correspond to one of various configurations. For example, a termination resistor of the I/F circuit 110a may be connected to a power supply voltage terminal or a ground voltage terminal. Thus, in some embodiments, the I/F circuit 110a may determine that the data signals DQ[7:0] correspond to a command CMD or an address ADDR when the second number of bits having a logic value of 0 is greater than a threshold value, for example, the first number of bits having a logic value of 1, and provide the command CMD or the address ADDR to the command path block CPB.

Figure 8:
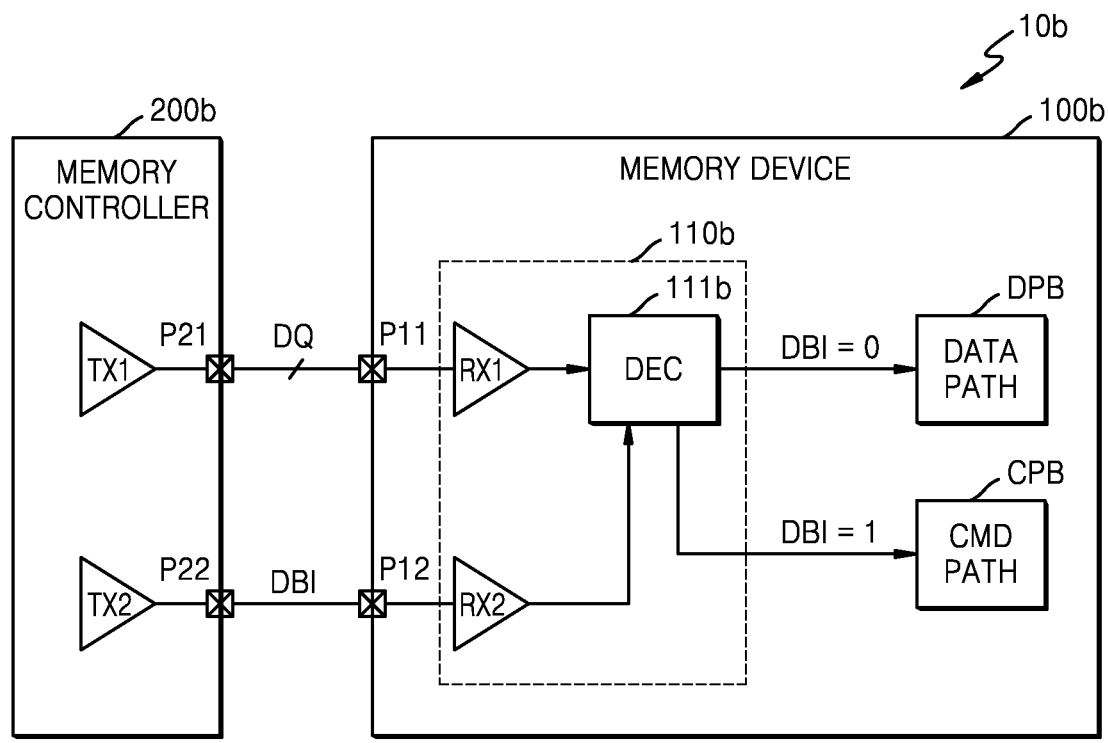
FIG. 8 is a block diagram showing a memory system according to an embodiment of the inventive concept.

FIG. 8 is a block diagram showing a memory system 10b according to an embodiment of the inventive concept.

Referring to FIG. 8, the memory system 10b includes a memory device 100b and a memory controller 200b. The memory device 100b may correspond to an implementation example of the memory device 100 of FIG. 2, and the memory controller 200b may correspond to an implementation example of the memory controller 200 of FIG. 2. Descriptions given above with reference to FIGS. 2 to 5 may be applied to the present embodiment.

The memory controller 200b includes the first pins P21, the second pin P22, the data signal transmitters TX1, and the DBI signal transmitter TX2. The memory device 100b includes the first pins P11, the second pin P12, an I/F circuit 110b, the data path block DPB, and the command path block CPB. For example, the data path block DPB may correspond to the page buffer 120 and the memory cell array 130 of FIG. 2, and the command path block CPB may correspond to the control logic circuit 140 of FIG. 2.

The I/F circuit 110*b* corresponds to an embodiment of the I/F circuit 110 of FIG. 2 and may include the data signal receivers RX1, the DBI signal receiver RX2, and a decoder 111*b*. The data signal receivers RX1 may provide a plurality of data signals DQ respectively received from the first pins P11 to the decoder 111*b*. The DBI signal receiver RX2 may provide a DBI signal DBI received from the second pin P12 to the decoder 111*b*. However, embodiments of the inventive concept are not limited thereto. For example, the DBI signal receiver RX2 may also provide a DBI signal DBI to the data path block DPB. For example, the data signal receivers RX1 and the DBI signal receiver RX2 may be implemented as input buffers. In an embodiment, the input buffers are implemented using operational amplifiers.

FIG. 9 is a table showing a plurality of data signals and DBI signals according to an embodiment of the inventive concept.

Referring to FIG. 9, even when the memory device 100 includes the second pin P12 for receiving the DBI signal DBI, a user may not utilize DBI encoding and set a DBI disable mode in which a DBI signal DBI is disabled as a default mode. In this case, regardless of the number of bits having a logic value of 0 or the number of bits having a logic value 1 included in a plurality of data signals DQ[7:0], a DBI signal DBI may have a disable level, that is, a bit having a logic value of 0. In the DBI disable mode in which the DBI signal DBI is at the disable level, the data signals DQ[7:0] and the DBI signal DBI may be divided into a first region 91 in which the number of bits having a logic value of 1 included in the data signals DQ[7:0] is not greater than the number of bits having a logic value of 0 and a second region 92 in which the number of bits having a logic value of 1 is greater than the number of bits having a logic value of 0, and the first region 91 and the second region 92 may be used as data regions.

On the other hand, in a DBI enable mode where the DBI signal DBI is selectively enabled according to the data signals DQ[7:0], the data signals DQ[7:0] and the DBI signal DBI may be divided into a third region 93 in which the DBI signal DBI has a value of 0 and a fourth region 94 in which the DBI signal DBI has a value of 1. In this case, the memory controller 200*b* may generate the fourth region 94 by enabling the DBI signal DBI for the second region 92 to define a command region or an address region.

FIG. 10 is a table showing signals corresponding to a data region and signals corresponding to command/address regions according to an embodiment of the inventive concept.

Referring to FIGS. 8 to 10 together, in the DBI disable mode in which a DBI signal DBI is set to the disable level regardless of the number of bits having a logic value of 1 and the number of bits having a logic value of 0 included in the data signals DQ[7:0], the first region 91 and the second region 92 may be used as data regions. Therefore, when the DBI signal DBI is at the disable level, the I/F circuit 110*b* may determine that the data signals DQ[7:0] correspond to data DATA and provide the data DATA to the data path block DPB.

In an embodiment, the fourth region 94 in which the DBI signal has the enable level may be used as a command region. In an embodiment, the fourth region 94 in which the DBI signal has the enable level may be used as an address region. In an embodiment, the fourth region 94 in which the DBI signal has the enable level may be used as a command/address region. Therefore, when the DBI signal DBI is at the enable level, the I/F circuit 110*b* may determine that the data signals DQ[7:0] correspond to a command CMD or an address ADDR and provide the command CMD or the address ADDR to the command path block CPB.

Further, in an embodiment, a fifth region 95 in which the DBI signal has the enable level may be used as a command region. In an embodiment, the fifth region 95 in which the DBI signal has the enable level may be used as an address region. In an embodiment, the fifth region 95 in which the DBI signal has the enable level may be used as a command/address region. Therefore, when the DBI signal DBI is at the enable level, the I/F circuit 110*b* may determine that the data signals DQ[7:0] correspond to a command CMD or an address ADDR and provide the command CMD or the address ADDR to the command path block CPB.

Figure 11:
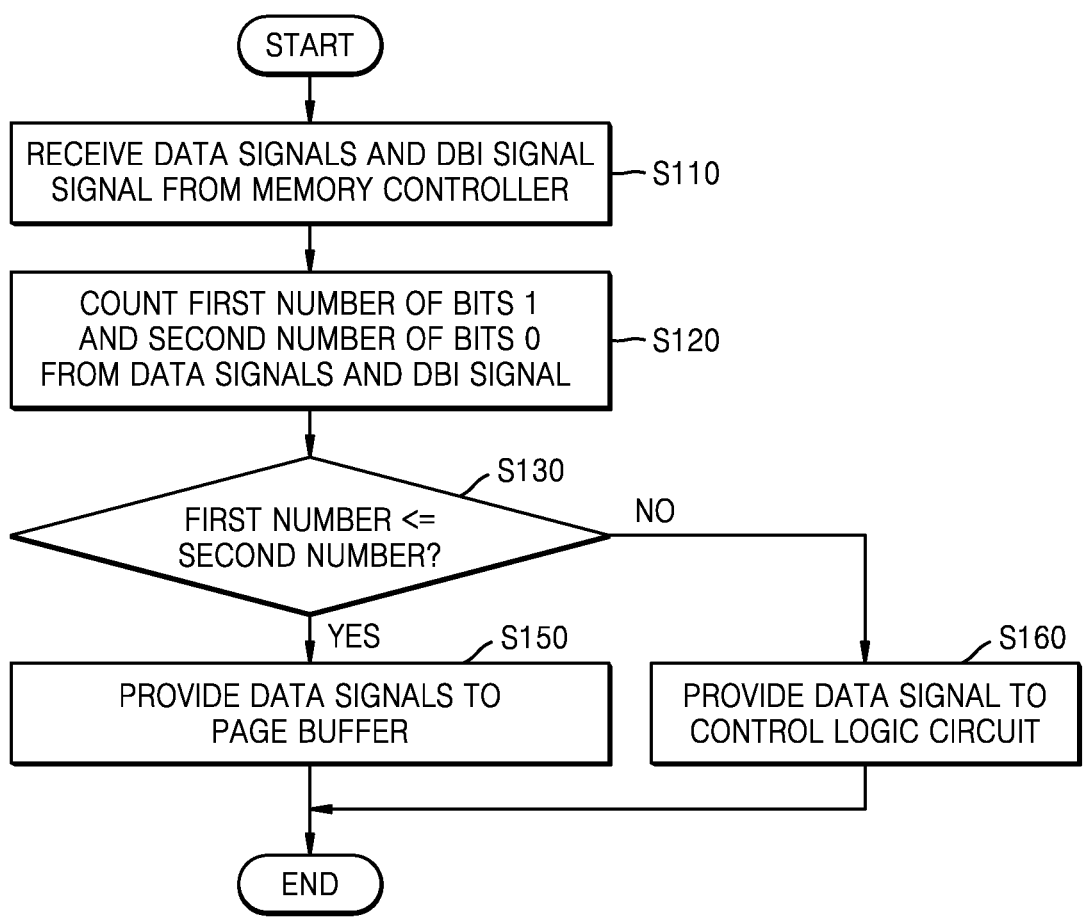
FIG. 11 is a flowchart of an operating method of a memory system according to an embodiment of the inventive concept.

FIG. 11 is a flowchart of an operating method of a memory system according to an embodiment of the inventive concept. Referring to FIG. 11, an operating method of a memory device according to the present embodiment is a method of transmitting/receiving data using a DBI encoding scheme and may be performed, for example, by the memory device 100 of FIG. 2. Hereinafter, descriptions will be given with reference to FIGS. 2 and 11 together.

In operation S110, the memory device 100 receives data signals DQ and a DBI signal DBI from the memory controller 200. In operation S120, the memory device 100 counts a first number of bits having a logic value of 1 and a second number of bits having a logic value of 0 in the data signals DQ and the DBI signal DBI. In operation S130, the memory device 100 determines whether the first number is less than or equal to the second number. As a result of the determination, when the first number is less than or equal to the second number, in operation S150, the memory device 100 provides the data signals DQ to the page buffer 120. As a result of the determination, when the first number is greater than the second number, in operation S160, the memory device 100 provides the data signals DQ to the control logic circuit 140.

However, embodiments of the inventive concept are not limited thereto. According to some embodiments, the memory device 100 determines whether the second number is less than or equal to the first number. As a result of the determination, when the second number is less than or equal to the first number, the memory device 100 provides the data signals DQ to the page buffer 120. As a result of the determination, when the second number is greater than the first number, the memory device 100 provides the data signals DQ to the control logic circuit 140.

Figure 12:
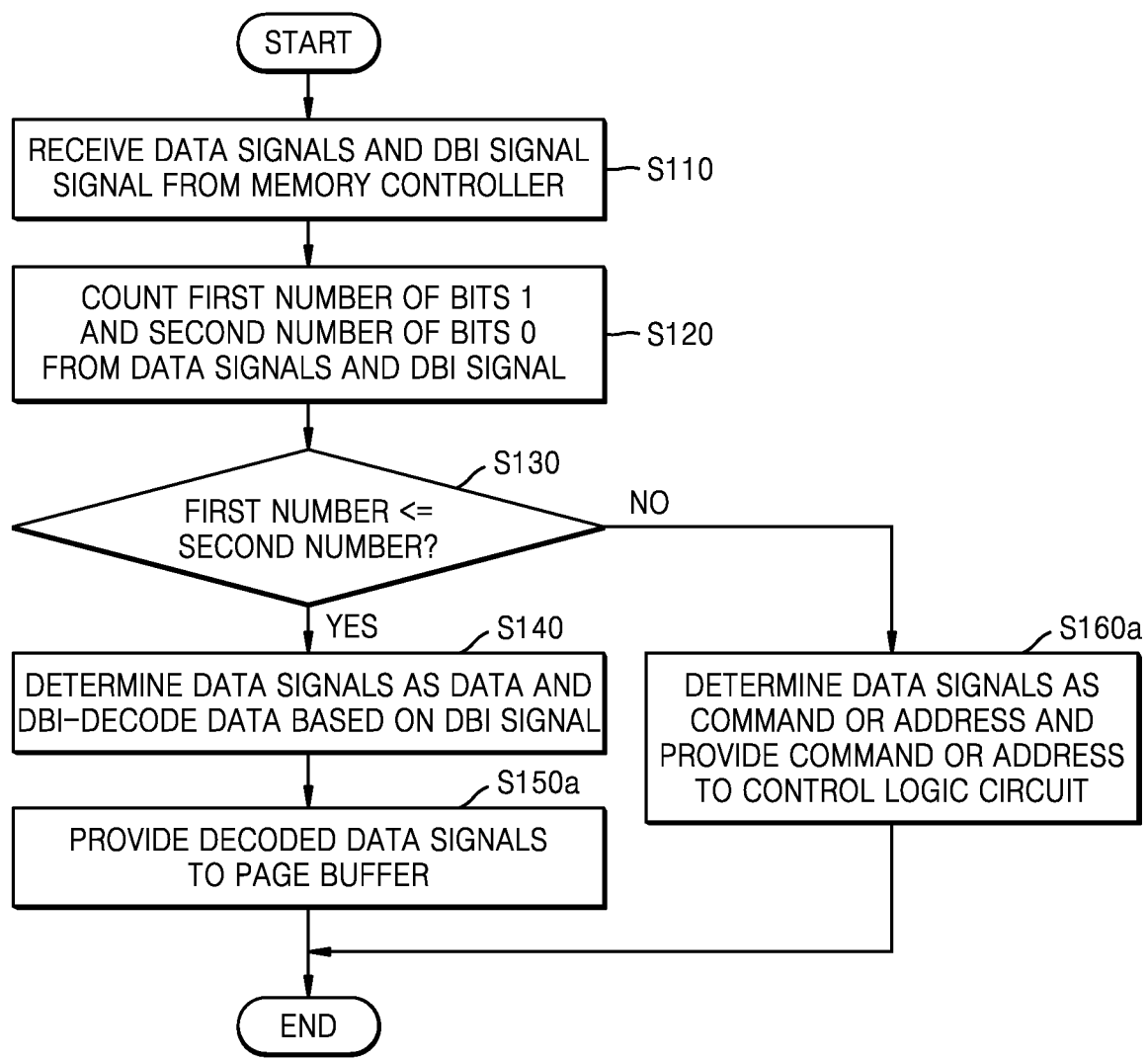
FIG. 12 is a flowchart of an operating method of a memory system according to an embodiment of the inventive concept.

FIG. 12 is a flowchart of an operating method of a memory system according to an embodiment of the inventive concept. Referring to FIG. 12, an operating method of a memory device according to the present embodiment may correspond to an implementation example of the operating method of FIG. 11. Therefore, descriptions given above with reference to FIG. 11 may also be applied to the present embodiment, and descriptions identical to those will be omitted.

In operation S140, the memory device 100 determines the data signals DQ as data DATA and performs DBI decoding of the data DATA based on the DBI signal DBI to generated decoded data. For example, the memory device 100 may determine that a data signal is data when the number of bits having a logic value 1 is less than or equal to the number of bits having a logical value of 0. The DBI decoding may include selectively inverting the data signal based on a value of the DBI signal DBI. In operation S150*a*, the memory device 100 provides the decoded data to the page buffer 120. In operation S160*a*, the memory device 100 determines the data signals DQ as a command CMD or an address ADDR and provides the command CMD or the address ADDR to the control logic circuit 140. For example, the memory device 100 may determine that a data signal is the command CMD or the address ADDR when the number of bits having a logic value 1 is greater than the number of bits having a logical value of 0.

However, embodiments of the inventive concept are not limited thereto. According to some embodiments, the memory device 100 may determine that a data signal is data when the number of bits having a logic value 0 is less than or equal to the number of bits having a logical value of 1. The DBI decoding may include selectively inverting the data signal based on a value of the DBI signal DBI, and memory device 100 may determine that a data signal is the command CMD or the address ADDR when the number of bits having a logic value 0 is greater than the number of bits having a logical value of 1.

Figure 13:
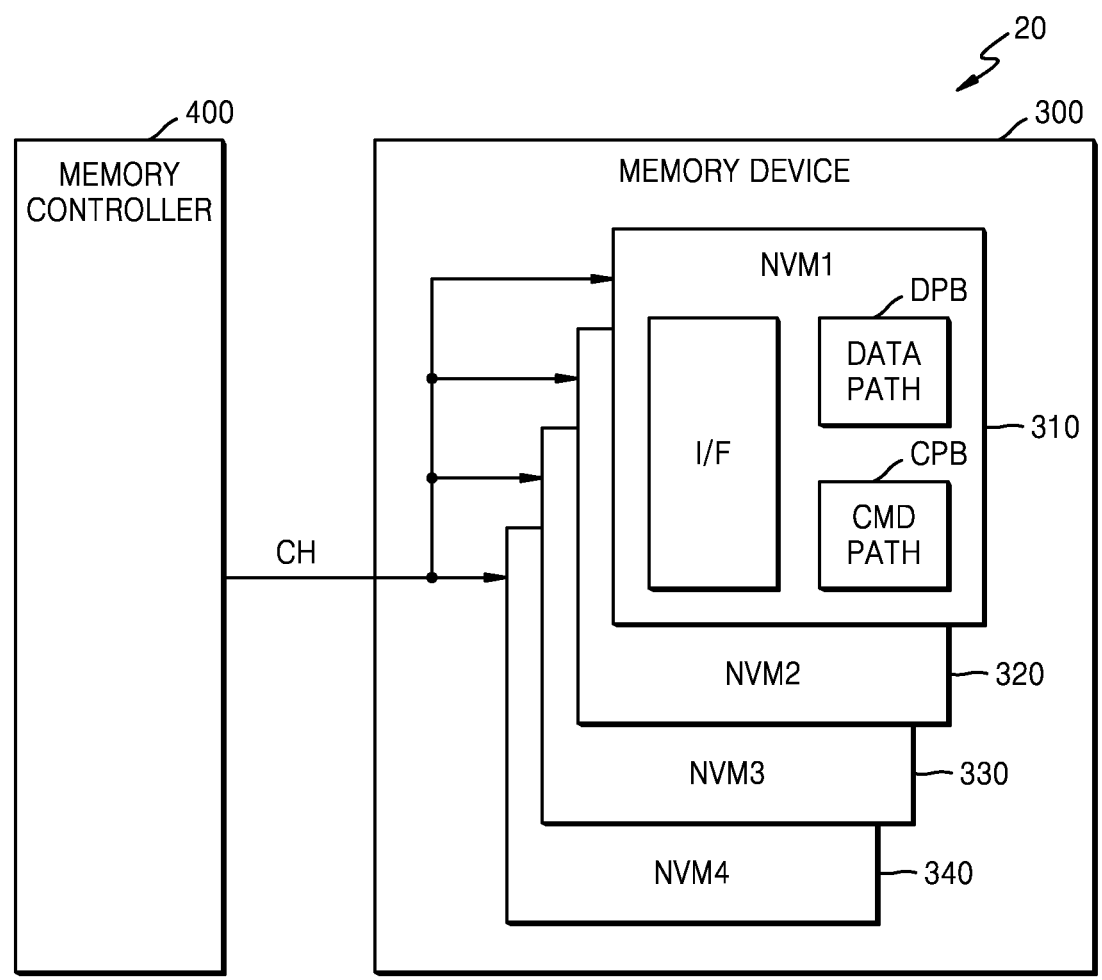
FIG. 13 is a block diagram showing a memory system according to an embodiment of the inventive concept.

FIG. 13 is a block diagram showing a memory system 20 according to an embodiment of the inventive concept.

Referring to FIG. 13, the memory system 20 includes a memory device 300 and a memory controller 400. The memory device 300 and the memory controller 400 may be connected to each other through a channel CH. The memory device 300 may include first to fourth memory chips NVM1 to NVM4 310 to 340. The memory device 300 may correspond to the memory device 11 of FIG. 1, the memory controller 400 may correspond to the memory controller 12 of FIG. 1, and the channel CH may correspond to one from among the channels CH1 to CHm. For example, the channel CH may correspond to the first channel CH1, and the first to fourth memory chips 310 to 340 may correspond to the non-volatile memories NVM11 to NVM1n.

The memory device 300 and the memory controller 400 may perform packet type communication and may support a DBI interface using a DBI signal. In an embodiment, the memory device 300 and the memory controller 400 may transmit and receive packets including a header, a data region, and a trailer. Detailed descriptions thereof will be given later with reference to FIGS. 14 and 15. In one embodiment, the memory device 300 and the memory controller 400 may transmit and receive packets including a header and a data region. Detailed descriptions thereof will be given later with reference to FIG. 16.

The first to fourth memory chips 310 to 340 may each include an I/F circuit I/F, a data path block DPB, and a command path block CPB. The I/F circuit I/F counts a first number of bits having a logic value of 1 and a second number of bits having a logic value of 0 from a plurality of data signals and a DBI signal received from the memory controller 400 through the channel CH and determines whether the data signals correspond to a header, a trailer, or a data region based on the counted first number and the counted second number. Also, the I/F circuit I/F may determine whether a plurality of data signals corresponding to a data region includes a command, an address, or data from a plurality of data signals corresponding to a header. Also, the I/F circuit I/F may determine a selected memory chip from a plurality of data signals corresponding to the header.

According to an embodiment, the memory controller 400 may transmit a packet corresponding to a command, a packet corresponding to an address, and a packet corresponding to data to the memory device 300 at the same rate. Also, the memory controller 400 may divide commands and data into time division signals and consecutively transmit them to the memory device 300. At this time, by using a way interleaving scheme, a command overhead may be reduced by overlapping the command overhead for one memory chip with data transmission time for another memory chip.

According to an present embodiment, information for distinguishing a data region is included in a header of a packet, and a command, address, or data may be included in a data region of the packet. Therefore, since the memory device 300 may determine whether a subsequent data region includes a command, an address, or data by decoding the header, the memory device 300 does not need to receive a command latch enable signal CLE, an address latch enable signal ALE, or a write enable signal nWE from the memory controller 400. Therefore, the memory device 300 need not include pins for receiving the command latch enable signal CLE, the address latch enable signal ALE, and the write enable signal nWE. Accordingly, the area occupied by the memory device 300 may be reduced. Also, since the overhead due to the command latch enable signal CLE or the overhead due to the address latch enable signal ALE may be reduced, tCMD may be reduced, and thus the I/O efficiency may be improved.

Figure 14:
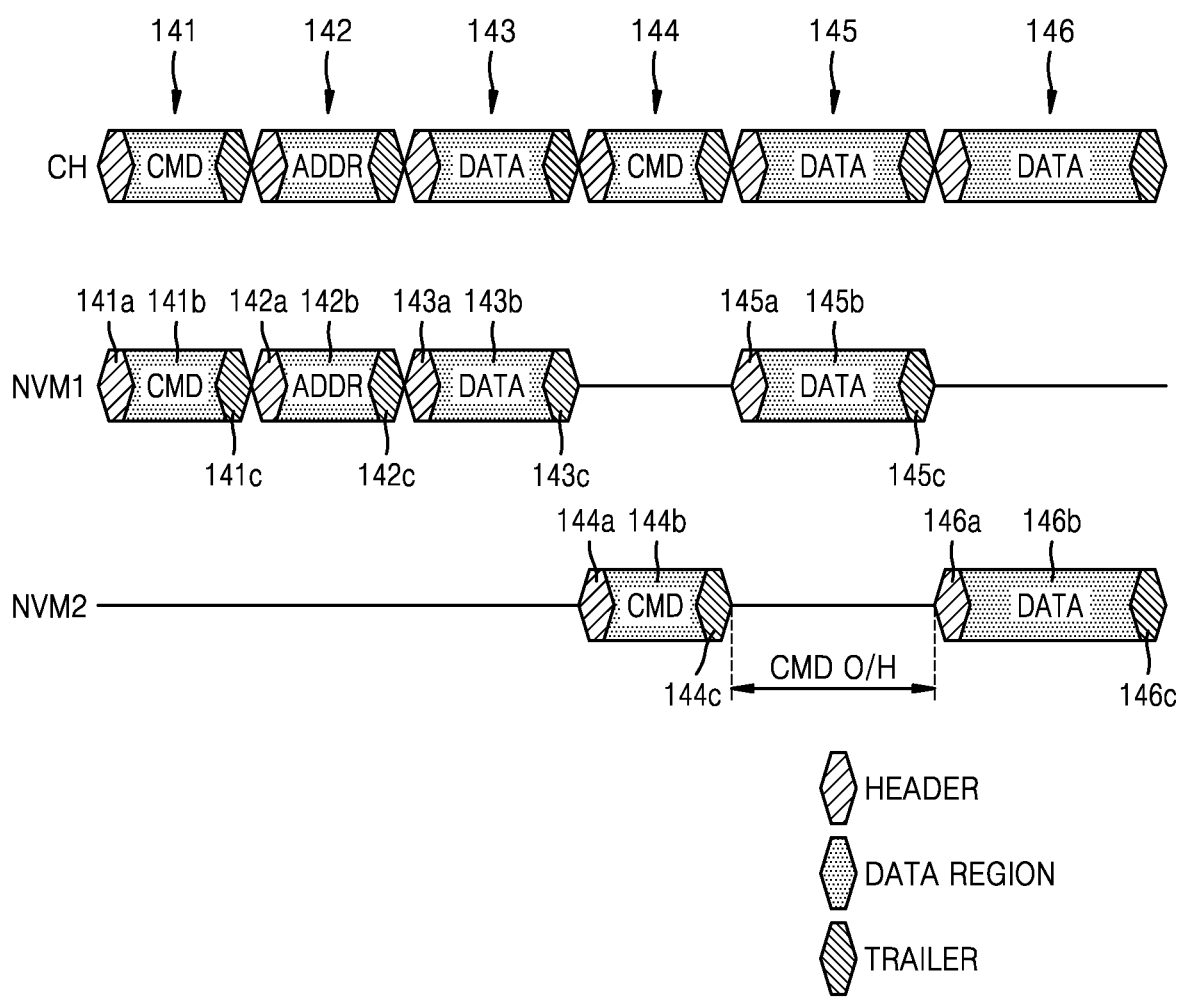
FIG. 14 is a diagram showing an example of packet type communication according to an embodiment of the inventive concept.

FIG. 14 is a diagram showing an example of packet type communication according to an embodiment of the inventive concept.

Referring to FIGS. 13 and 14 together, the memory controller 400 may sequentially transmit a plurality of packets including first to sixth packets 141 to 146 to the memory device 300 through the channel CH. The first to sixth packets 141 to 146 may each include a header, a data region, and a trailer. For example, first, second, third, and fifth packets 141, 142, 143, and 145 may be transmitted to a first memory chip NVM1 310, and fourth and sixth packets 144 and 146 may be transmitted to a second memory chip NVM2 320. In this case, information regarding a selected memory chip may be included in the header of each of the first to sixth packets 141 to 146. For example, the header of the first packet 141 may indicate that the first memory chip NVM1 310 is the selected memory chip and the header of the fourth packet 144 may indicate that the second memory chip NVM2 320 is the selected memory chip. The first packet 141 includes a header 141*a*, a data region 141*b*, and a trailer 141*c*. The second packet 142 include a header 142*a*, a data region 142*b*, and a trailer 142*c*. The third packet 143 include a header 143*a*, a data region 143*b*, and a trailer 143*c*. The fourth packet 144 include a header 144*a*, a data region 144*b*, and a trailer 144*c*. The fifth packet 145 include a header 145*a*, a data region 145*b*, and a trailer 145*c*. The sixth packet 146 include a header 146*a*, a data region 146*b*, and a trailer 146*c*.

In the case of the second memory chip NVM2 320, a command overhead CMD O/H may occur between a fourth packet 144 corresponding to a command CMD and a sixth packet 146 corresponding to data DATA. However, according to the present embodiment, a transmission time of a fifth packet 145 corresponding to data for the first memory chip NVM1 310 and the command overhead CMD O/H of the second memory chip NVM2 320 may overlap. At this time, since transmission time of the fifth packet 145 is included in tDMA and the command overhead CMD O/H of the second memory chip NVM2 320 is included in tCMD, tCMD and tDMA may overlap. As a result, I/O efficiency of the memory device 300 may be improved.

In an embodiment, data signals corresponding to a data region may correspond to data signals to which DBI encoding is applied, and data signals corresponding to a header and a trailer may correspond to data signals to which DBI encoding is not applied. For example, a plurality of data signals corresponding to a header and a trailer may correspond to the second region 62 of FIGS. 6 and 7, and a plurality of data signals corresponding to a data region may correspond to the third region 63 and the fourth region 64 of FIGS. 6 and 7.

Therefore, the I/F circuit I/F may count a first number of bits having a logic value of 1 and a second number of bits having a logic value of 0 from data signals and a DBI signal and, based on the counted first number and the counted second number, may determine whether the data signals correspond to a header or a trailer or whether the data signals correspond to a data region. For example, the I/F circuit (I/F) may determine that the data signals correspond to a header or a trailer when the first number of bits having a logic value of 1 in the data signals is equal to or greater than a reference number of 5. For example, the I/F circuit (I/F) may determine that the data signals correspond to a data region when the first number of bits having a logic value of 1 in the data signals is less than the reference number of 5.

In an embodiment, data signals corresponding to a data region may correspond to DBI-disabled data signals, and data signals corresponding to a header and a trailer may correspond to DBI-enabled data signals. For example, a plurality of data signals corresponding to a header and a trailer may correspond to the fourth region 94 of FIGS. 9 and 10, and a plurality of data signals corresponding to a data region may correspond to the first region 91 and the second region 92 of FIGS. 9 and 10.

Therefore, the I/F circuit I/F may determine whether data signals correspond to a header or a trailer or whether the data signals correspond to a data region based on a DBI signal and data signals. For example, when a DBI signal is at the enable level and the first number of bits having a logical value of 1 in data signals is less than the second number of bits having a logic value of 0, the interface circuit I/F may determine that the data signals correspond to a header or a trailer. However, embodiments of the inventive concept are not limited thereto. According to some embodiments, when a DBI signal is at the enable level and the second of bits having a logical value of 0 in data signals is less than the first number of bits having a logic value of 1, the interface circuit I/F may determine that the data signals correspond to a header or a trailer. For example, when the DBI signal is at the disable level, the I/F circuit I/F may determine that the data signals correspond to a data region.

FIG. 15 is a table showing a command header, a data header, and an address header according to an embodiment of the inventive concept.

Referring to FIGS. 14 and 15 together, a header may be divided into a first region and a second region. For example, the first region of the header may correspond to data signals DQ[7:2], and the second region of the header may correspond to data signals DQ[1:0]. In an embodiment, the first region has a size larger than the second region. The data signals DQ[7:2] corresponding to the first region may be a data region determination region indicating information included in a subsequent data region. The data signals DQ[1:0] corresponding to the second region may be a chip address region indicating a selected memory chip from among a plurality of memory chips.

For example, data signals DQ[7:2] corresponding to the first region of each of command headers 141a and 144a may be 111111, data signals DQ[7:2] corresponding to the first region of each of data headers 143a, 145a, and 146a may be 101111, and data signals DQ[7:2] corresponding to the first region of an address header 142a may be 011111. However, embodiments of the inventive concept are not limited thereto. For example, the number and configuration of data signals corresponding to a first region may vary according to embodiments.

The number of data signals corresponding to the second region of the header may be determined according to the number of memory chips connected to the channel CH in the memory device 300. In an embodiment, when the memory device 300 includes the first to fourth memory chips 310 to 340 connected to the channel CH, data signals corresponding to the second region of the header may be DQ[1:0]. For example, two bits of the header may be used to distinguish the selected memory chips. In an embodiment, when the memory device 300 includes 8 memory chips connected to the channel CH, data signals corresponding to the second region of the header may be DQ[2:0]. For example, three bits of the header may be used to distinguish the selected memory chips. As described above, the number of data signals corresponding to the second region of the header may vary according to embodiments.

For example, the selected memory chip may correspond to a first memory chip 310 when the data signals DQ[1:0] corresponding to the second region of the header is 00, the selected memory chip may correspond to a second memory chip 320 when the data signals DQ[1:0] corresponding to the second region of the header is 01, the selected memory chip may correspond to a third memory chip 330 when the data signals DQ[1:0] corresponding to the second region of the header is 10, and the selected memory chip may correspond to a fourth memory chip 340 when the data signals DQ[1:0] corresponding to the second region of the header is 11.

Figure 16:
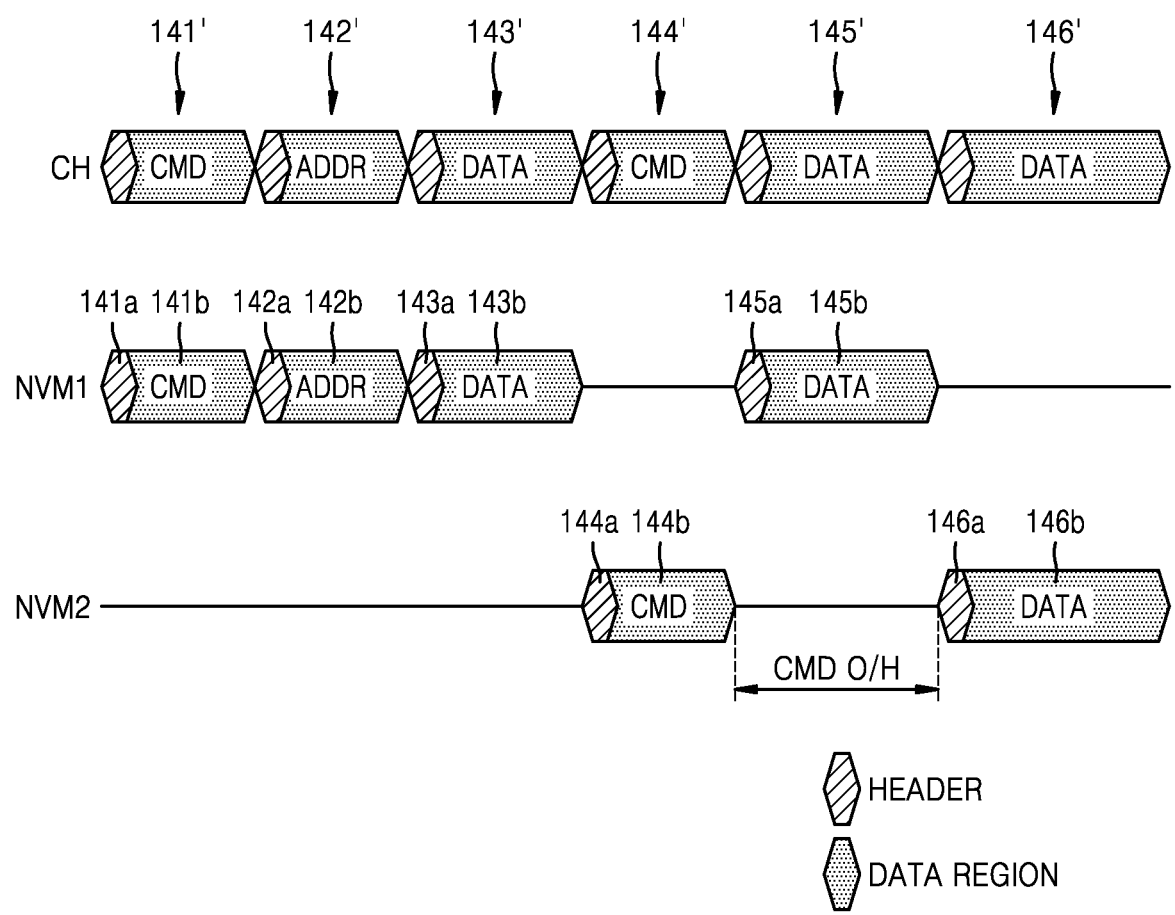
FIG. 16 is a diagram showing another example of packet type communication according to an embodiment of the inventive concept.

FIG. 16 is a diagram showing another example of packet type communication according to an embodiment of the inventive concept.

Referring to FIGS. 13 and 16 together, the memory controller 400 may sequentially transmit a plurality of packets including first to sixth packets 141' to 146' to the memory device 300 through the channel CH. The first to sixth packets 141' to 146' may each include a header and a data region. For example, first, second, third, and fifth packets 141', 142', 143', and 145' may be transmitted to the first memory chip NVM1 310, and fourth and sixth packets 144' and 146' may be transmitted to the second memory chip NVM2 320. The first to sixth packets 141' to 146' differ from the first to sixth packets 141 to 146 of FIG. 14 since they do not include a trailer, and descriptions given above with reference to FIGS. 14 and 5 may also be applied to the present embodiment.

Figure 17:
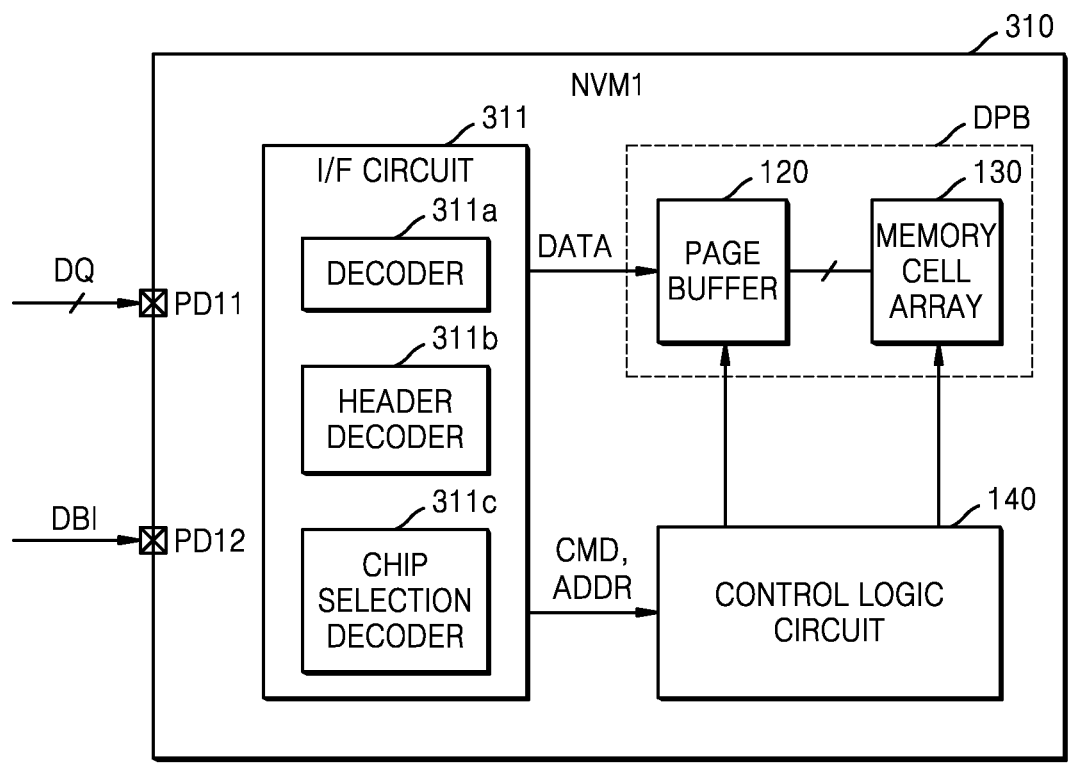
FIG. 17 is a block diagram showing a first memory chip according to an embodiment of the inventive concept.

FIG. 17 is a block diagram showing a first memory chip 310 according to an embodiment of the inventive concept.

Referring to FIGS. 13 and 17, the first memory chip 310 includes data signal pads PD11, a DBI signal pad PD12, an I/F circuit 311, the page buffer 120, the memory cell array 130, and the control logic circuit 140. Second to fourth memory chips 320 to 340 may also be implemented similarly as the first memory chip 310.

Although not shown, the first memory chip 310 may include the first to fourth pins P11 to P14 similar to the memory device 100 of FIG. 2, and the first to fourth pins P11 to P14 may be connected to the first to fourth memory chips 310 to 340 in common. The first to fourth memory chips 310 to 340 may each include pads respectively connected to first to fourth pins P11 to P14.

The data signal pads PD11 may be connected to the first pins P11, respectively. The I/F circuit 311 may receive a plurality of data signals DQ from the memory controller 400 through the data signal pads PD11, respectively. The I/F circuit 311 may receive a DBI signal DBI from the memory controller 400 through the DBI signal pad PD12.

The I/F circuit 311 may include a decoder 311a, a header decoder 311b, and a chip selection decoder 311c. In an embodiment, the decoder 311a may receive a plurality of data signals DQ and a DBI signal DBI. For example, the decoder 311a may be implemented similar to the decoder 111 of FIG. 4, and thus the decoder 311a may include a data signal decoder and a DBI decoder. Descriptions given above with reference to FIG. 4 may be applied to the present embodiment.

In an embodiment, the decoder 311a may determine whether a plurality of data signals DQ correspond to a header, a trailer, or a data region based on a first number of bits having a logic value of 1 and a second number of bits having a logic value of 0 included in the data signals DQ. For example, as shown in FIG. 14, when each packet includes a header, a data region, and a trailer, the decoder 311a may determine that the data signals DQ correspond to a data region when the first number of bits having a logic value of 1 included in the data signals DQ is less than or equal to the second number of bits having a logic value of 0. The decoder 311a may determine that the data signals DQ correspond to a header or a trailer when the first number of bits having a logic value of 1 included in the data signals DQ is greater than the second number of bits having a logic value of 0. However, embodiments of the inventive concept are not limited thereto. According to some embodiments, the decoder 311a may determine that the data signals DQ correspond to a data region when the second number of bits having a logic value of 0 included in the data signals DQ is less than or equal to the first number of bits having a logic value of 1. The decoder 311a may determine that the data signals DQ correspond to a header or a trailer when the second number of bits having a logic value of 0 included in the data signals DQ is greater than the first number of bits having a logic value of 1. For example, as shown in FIG. 16, when each packet includes a header and a data region, the decoder 311a may determine that the data signals DQ correspond to a data region when the first number of bits having a logic value of 1 included in the data signals DQ is less than or equal to the second number of bits having a logic value of 0 and may determine that the data signals DQ correspond to a header when the first number of bits having a logic value of 1 included in the data signals DQ is greater than the second number of bits having a logic value of 0. However, embodiments of the inventive concept are not limited thereto. According to some embodiments, the decoder 311a may determine that the data signals DQ correspond to a data region when the second number of bits having a logic value of 0 included in the data signals DQ is less than or equal to the first number of bits having a logic value of 1 and may determine that the data signals DQ correspond to a header when the second number of bits having a logic value of 0 included in the data signals DQ is greater than the first number of bits having a logic value of 1.

The header decoder 311b may determine information included in a subsequent data region based on a plurality of data signals (e.g., DQ[7:2] in FIG. 15) corresponding to the first region of the header. The chip selection decoder 311c may determine a selected memory chip from among a plurality of memory chips based on a plurality of data signals (e.g., DQ[1:0] in FIG. 15) corresponding to the second region of the header. For example, the chip selection decoder 311c may determine a selected memory chip based on lower bits of data signal.

For example, as a result of the determination by the chip select decoder 311c, the first memory chip 310 may be the selected memory chip. In this case, when the header decoder 311b determines that a subsequent data region corresponds to data DATA, the I/F circuit 311 may provide the data DATA to the data path block DPB. On the other hand, when the header decoder 311b determines that a subsequent data region corresponds to a command CMD or an address ADDR, the I/F circuit 311 may provide the command CMD or the address ADDR to the control logic circuit 140.

For example, when the chip select decoder 311c determines that the first memory chip 310 is not a selected memory chip, the I/F circuit 311 does not provide a subsequent data region to the data path block DPB and the control logic circuit 140. For example, when the chip select decoder 311c determines that the first memory chip 310 is not the selected memory chip, the I/F circuit 311 may disable the decoder 311a and/or the header decoder 311b.

Figure 18:
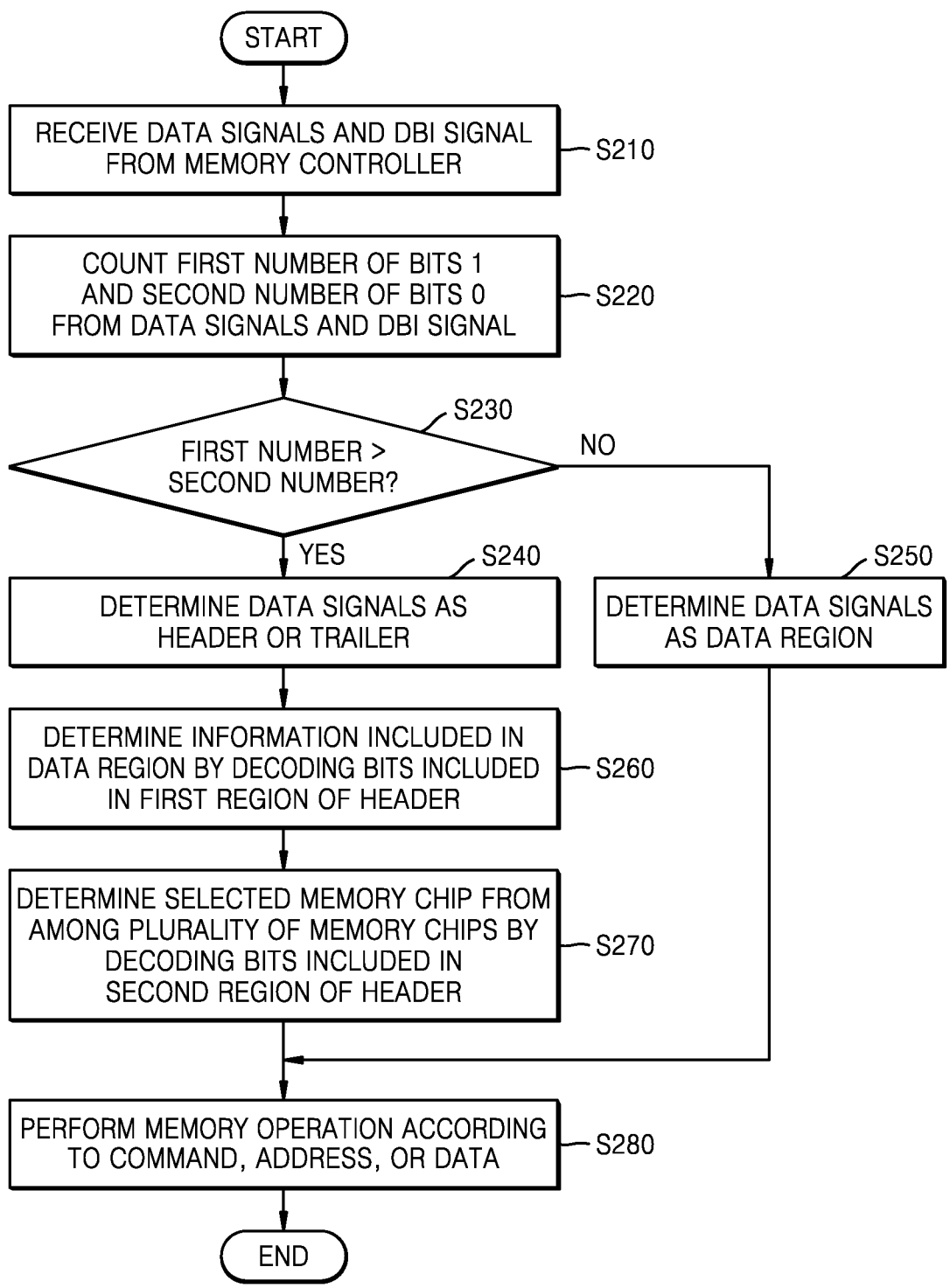
FIG. 18 is a flowchart of an operating method of a memory system according to an embodiment of the inventive concept.

FIG. 18 is a flowchart of an operating method of a memory system according to an embodiment of the inventive concept. Referring to FIG. 11, an operating method of a memory device according to the present embodiment is a method of transmitting/receiving packet-type data using a DBI encoding scheme and may be performed, for example, by the memory device 300 of FIG. 13 or the first memory chip 310 of FIG. 17. Hereinafter, descriptions will be given with reference to FIGS. 13, 17, and 18 together.

In operation S210, the first memory chip 310 receives data signals DQ and a DBI signal DBI from the memory controller 400. In operation S220, the first memory chip 310 counts a first number of bits having a logic value of 1 and a second number of bits having a logic value of 0 from the data signals DQ and the DBI signal DBI. In operation S230, the first memory chip 310 determines whether the first number is greater than the second number. When it is determined that the first number is greater than the second number, in operation S240, the first memory chip 310 determines the data signals DQ as a header or a trailer. On the other hand, when it is determined that the first number is not greater than the second number, in operation S250, the first memory chip 310 determines the data signals DQ as a data region.

However, embodiments of the inventive concept are not limited thereto. According to some embodiments, when it is determined that the second number is greater than the first number, the first memory chip 310 may determine the data signals DQ as a header or a trailer. On the other hand, when it is determined that the second number is not greater than the first number, the first memory chip 310 may determine the data signals DQ as a data region.

In operation S260, the first memory chip 310 determines information included in a subsequent data region by decoding bits included in a first region of the header. In operation S270, the first memory chip 310 determines a selected memory chip from among a plurality of memory chips by decoding bits included in a second region of the header. In operation S280, the first memory chip 310 performs a memory operation according to a command CMD, an address ADDR, and data DATA. The memory operation may be performed on the selected memory chip.

Figure 19:
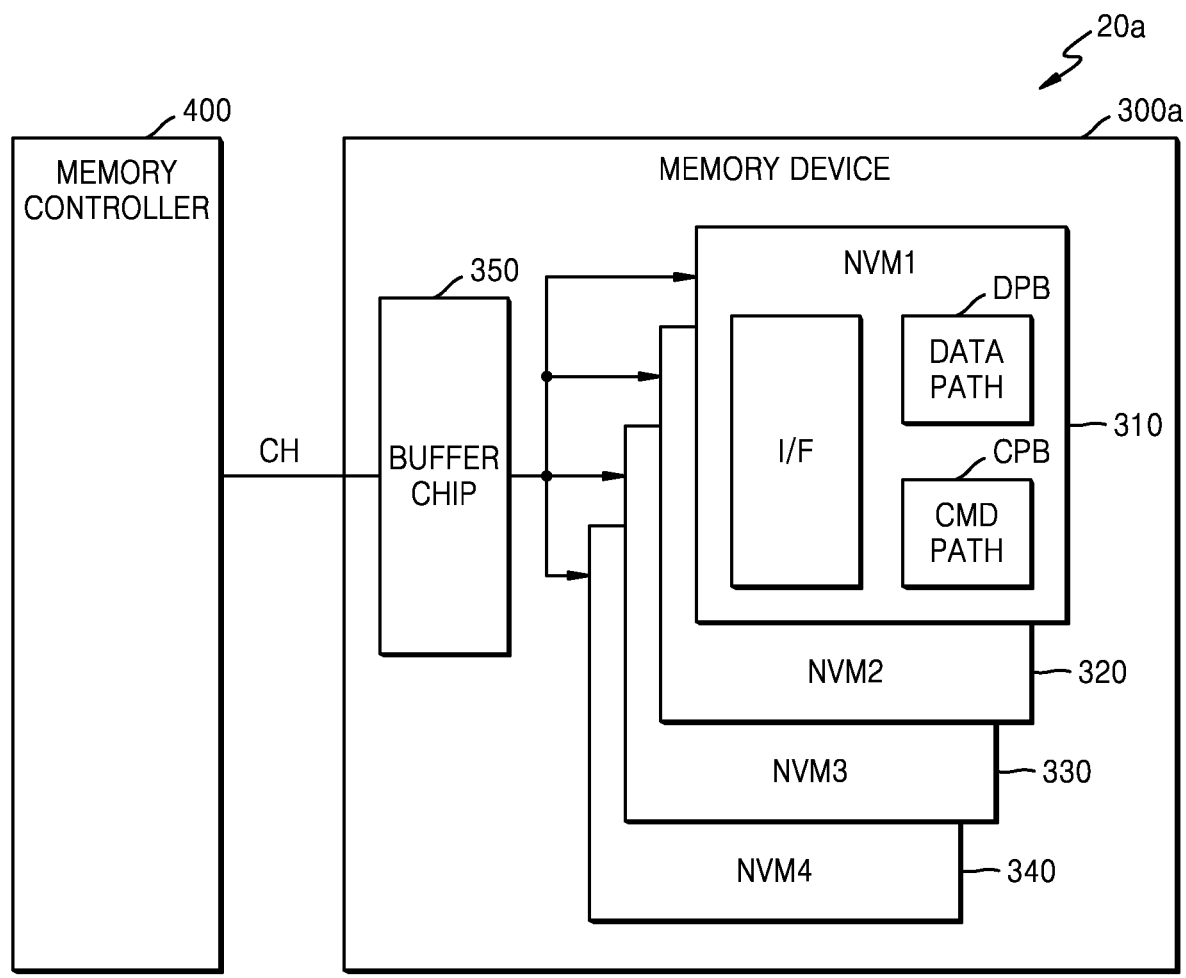
FIG. 19 is a block diagram showing a memory system according to an embodiment of the inventive concept.

FIG. 19 is a block diagram showing a memory system 20a according to an embodiment of the inventive concept.

Referring to FIG. 19, the memory system 20a includes a memory device 300a and a memory controller 400. The memory system 20a according to the present embodiment may correspond to a modified example of the memory system 20 of FIG. 13. In detail, the memory device 300a further includes a buffer chip 350 compared to the memory device 300 of FIG. 13. The buffer chip 350 may be connected between the memory controller 400 and the first to fourth memory chips 310 to 340 and may be connected to the memory controller 400 through the channel CH. The buffer chip 350 may also be referred to as a frequency boosting interface (FBI) circuit. In an embodiment, the first to fourth memory chips 310 to 340 and the buffer chip 350 may be implemented in a single package. However, embodiments of the inventive concept are not limited thereto. For example, the first to fourth memory chips 310 to 340 and the buffer chip 350 may be implemented in different packages.

In an embodiment, the memory controller 400 and the memory device 300a may transmit and receive data signals according to a DBI encoding scheme. For example, the memory controller 400 may transmit a data signal corresponding to the third region 63 and the fourth region 64 shown in FIGS. 6 and 7 to the memory device 300a. In this case, the buffer chip 350 may transmit the data signal received from the memory controller 400 to the first to fourth memory chips 310 to 340.

In an embodiment, the memory controller 400 and the memory device 300a may transmit and receive packet type data through a DBI interface. In an embodiment, the buffer chip 350 determines whether a plurality of data signals received from the memory controller 400 corresponds to a header, a trailer, or a data region by determining a first number of bits having a logic value of 1 and a second number of bits having a logic value of 0 from the data signals. For example, the buffer chip 350 may include the same configuration as the decoder 311a of FIG. 17. Also, the buffer chip 350 may determine a selected memory chip from among the first to fourth memory chips 310 to 340 by decoding a plurality of data signals corresponding to the header and transmit a plurality of data signals to the selected memory chip. For example, the buffer chip 350 may include the same configuration as the chip select decoder 311c of FIG. 17.

In an embodiment, the memory controller 400 may generate a plurality of data signals (hereinafter referred to as 'controller signals') for the memory device 300a, and the buffer chip 350 may generate a plurality of signals for the first to fourth memory chips 310 to 340 (hereinafter referred to as 'buffer chip signals'). For example, the buffer chip signals may correspond to a training command indicating a training operation of the first to fourth memory chips 310 to 340.

For example, the controller signals may correspond to signals encoded according to the DBI encoding scheme (e.g., the third region 63 and the fourth region 64 of FIGS. 6 and 7), and the buffer chip signals may correspond to signals not encoded according to the DBI encoding scheme (e.g., the second region 62 of FIGS. 6 and 7). The first to fourth memory chips 310 to 340 may determine whether received data signals are controller signals or buffer chip signals by decoding data signals and a DBI signal.

Figure 20:
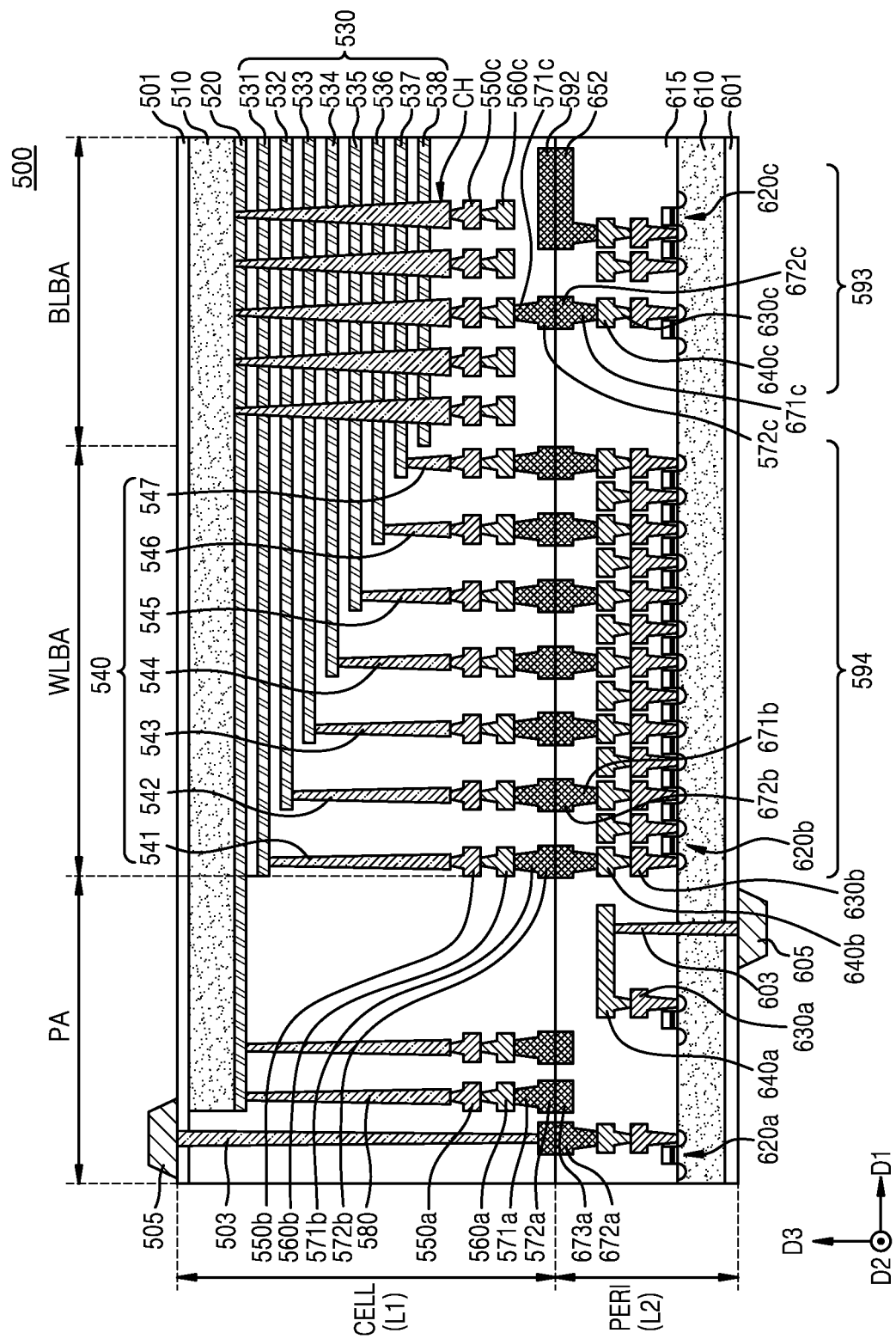
FIG. 20 is a diagram for describing a B-VNAND structure that may be applied to a memory device according to an embodiment of the inventive concept.

FIG. 20 is a diagram for describing a bonding vertical NAND (B-VNAND) structure that may be applied to a memory device according to an embodiment of the inventive concept. When a non-volatile memory included in a memory device is implemented as a B-VNAND type flash memory, the non-volatile memory may have the structure shown in FIG. 20.

Referring to FIG. 20, a cell region CELL of a memory device 500 may correspond to a first semiconductor layer L1, and a peripheral circuit region PERI may correspond to a second semiconductor layer L2. The peripheral circuit region PERI and the cell region CELL of the memory device 500 may each include an external pad bonding region PA, a word line bonding region WLBA, and a bit line bonding region BLBA.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c formed on the first metal layers 630a, 630b, and 630c. In an example embodiment, the first metal layers 630a, 630b, and 630c may be formed of tungsten having relatively high resistivity, and the second metal layers 640a, 640b, and 640c may be formed of copper having relatively low resistivity.

In an example embodiment, although only the first metal layers 630a, 630b, and 630c and the second metal layers 640a, 640b, and 640c are shown and described, the example embodiment is not limited thereto, and one or more additional metal layers may be further formed on the second metal layers 640a, 640b, and 640c. At least a portion of the one or more additional metal layers formed on the second metal layers 640a, 640b, and 640c may be formed of aluminum or the like having a lower resistivity than those of copper forming the second metal layers 640a, 640b, and 640c.

The interlayer insulating layer 615 may be disposed on the first substrate 610 and cover the plurality of circuit elements 620a, 620b, and 620c, the first metal layers 630a, 630b, and 630c, and the second metal layers 640a, 640b, and 640c. The interlayer insulating layer 615 may include an insulating material such as silicon oxide, silicon nitride, or the like.

Lower bonding metals 671b and 672b may be formed on the second metal layer 640b in the word line bonding area WLBA. In the word line bonding area WLBA, the lower bonding metals 671b and 672b in the peripheral circuit region PERI may be electrically bonded to upper bonding metals 571b and 572b of the cell region CELL. The lower bonding metals 671b and 672b and the upper bonding metals 571b and 572b may be formed of aluminum, copper, tungsten, or the like. Further, the upper bonding metals 571b and 572b in the cell region CELL may be referred as first metal pads and the lower bonding metals 671b and 672b in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a direction (a third direction D3), perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in a direction (a third direction D3), perpendicular to the upper surface of the second substrate 510, and pass through the plurality of word lines 530, the at least one string select line, and the at least one ground select line. The channel structure CH may include a data storage layer, a channel layer, a buried insulating layer, and the like, and the channel layer may be electrically connected to a first metal layer 550c and a second metal layer 560c. For example, the first metal layer 550c may be a bit line contact, and the second metal layer 560c may be a bit line. In an example embodiment, the bit line 560c may extend in a second direction D2, parallel to the upper surface of the second substrate 510.

In an example embodiment, an area in which the channel structure CH, the bit line 560c, and the like are disposed may be defined as the bit line bonding area BLBA. In the bit line bonding area BLBA, the bit line 560c may be electrically connected to the circuit elements 620c providing a page buffer 593 in the peripheral circuit region PERI. The bit line 560c may be connected to upper bonding metals 571c and 572c in the cell region CELL, and the upper bonding metals 571c and 572c may be connected to lower bonding metals 671c and 672c connected to the circuit elements 620c of the page buffer 593. In an example embodiment, the page buffer 593 may correspond to the page buffer described above with reference to FIGS. 2, 4, and 17.

In the word line bonding area WLBA, the plurality of word lines 530 may extend in a first direction D1, parallel to the upper surface of the second substrate 510, and may be connected to a plurality of cell contact plugs 541 to 547 (i.e., 540). The plurality of word lines 530 and the plurality of cell contact plugs 540 may be connected to each other in pads provided by at least a portion of the plurality of word lines 530 extending in different lengths in the second direction. A first metal layer 550b and a second metal layer 560b may be connected to an upper portion of the plurality of cell contact plugs 540 connected to the plurality of word lines 530, sequentially. The plurality of cell contact plugs 540 may be connected to the peripheral circuit region PERI by the upper bonding metals 571b and 572b of the cell region CELL and the lower bonding metals 671b and 672b of the peripheral circuit region PERI in the word line bonding area WLBA.

The plurality of cell contact plugs 540 may be electrically connected to the circuit elements 620b providing a row decoder 594 in the peripheral circuit region PERI. In an example embodiment, operating voltages of the circuit elements 620b providing the row decoder 594 may be different from operating voltages of the circuit elements 620c providing the page buffer 593. For example, operating voltages of the circuit elements 620c providing the page buffer 593 may be greater than operating voltages of the circuit elements 620b providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550a and a second metal layer 560a may be stacked on an upper portion of the common source line contact plug 580, sequentially. For example, an area in which the common source line contact plug 580, the first metal layer 550a, and the second metal layer 560a are disposed may be defined as the external pad bonding area PA.

Input-output pads 605 and 505 may be disposed in the external pad bonding area PA. A lower insulating film 601 covering a lower surface of the first substrate 610 may be formed below the first substrate 610, and a first input-output pad 605 may be formed on the lower insulating film 601. The first input-output pad 605 may be connected to at least one of the plurality of circuit elements 620a, 620b, and 620c disposed in the peripheral circuit region PERI through a first input-output contact plug 603, and may be separated from the first substrate 610 by the lower insulating film 601. In addition, a side insulating film may be disposed between the first input-output contact plug 603 and the first substrate 610 to electrically separate the first input-output contact plug 603 and the first substrate 610.

An upper insulating film 501 covering the upper surface of the second substrate 510 may be formed on the second substrate 510, and a second input-output pad 505 may be disposed on the upper insulating film 501. The second input-output pad 505 may be connected to at least one of the plurality of circuit elements 620a, 620b, and 620c disposed in the peripheral circuit region PERI through a second input-output contact plug 503. For example, the second input-output pad 505 may be electrically connected to the circuit element 620a via metal pattern 672a by the second input-output contact plug 503.

According to embodiments, the second substrate 510 and the common source line 520 may not be disposed in an area in which the second input-output contact plug 503 is disposed. Also, the second input-output pad 505 may not overlap the word lines 530 in the third direction (the third direction D3). The second input-output contact plug 503 may be separated from the second substrate 510 in a direction, parallel to the upper surface of the second substrate 510, and may pass through an interlayer insulating layer of the cell region CELL to be connected to the second input-output pad 505.

According to embodiments, the first input-output pad 605 and the second input-output pad 505 may be selectively formed. For example, the memory device 400 may include only the first input-output pad 605 disposed on the first substrate 610 or the second input-output pad 505 disposed on the second substrate 510. Alternatively, the memory device 400 may include both the first input-output pad 605 and the second input-output pad 505.

A metal pattern provided on an uppermost metal layer may be provided as a dummy pattern or the uppermost metal layer may be absent, in each of the external pad bonding area PA and the bit line bonding area BLBA, included in each of the cell region CELL and the peripheral circuit region PERI.

In the external pad bonding area PA, the memory device 500 may include a lower metal pattern 673a, corresponding to an upper metal pattern 572a formed in an uppermost metal layer of the cell region CELL, and having the same cross-sectional shape as the upper metal pattern 572a of the cell region CELL so as to be connected to each other, in an uppermost metal layer of the peripheral circuit region PERI. In the peripheral circuit region PERI, the lower metal pattern 673a formed in the uppermost metal layer of the peripheral circuit region PERI may not be connected to a contact. The upper metal pattern 572a may be connected to the second metal layer 560a by a contact 571a. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by a Cu-to-Cu bonding.

Further, in the bit line bonding area BLBA, an upper metal pattern 592, corresponding to a lower metal pattern 652 formed in the uppermost metal layer of the peripheral circuit region PERI, and having the same cross-sectional shape as the lower metal pattern 652, may be formed in an uppermost metal layer of the cell region CELL. A contact may not be formed on the upper metal pattern 592 formed in the uppermost metal layer of the cell region CELL.

In an example embodiment, the memory cell array 130 of FIG. 4 may be disposed in the cell region CELL, and the I/F circuit 110, the page buffer 120, the control logic circuit 140, the voltage generator 150, and/or the row decoder 160 of FIG. 4 may be arranged in the peripheral circuit region PERI. For example, I/F circuits 110, 110*a*, and 110*b* and the control logic circuit 140 described with reference to FIGS. 2, 4, 5, and 8 may be arranged in the peripheral circuit region PERI. For example, the I/F circuit I/F and the command path block CPB described with reference to FIGS. 13 and 19 may be arranged in the peripheral circuit region PERI. For example, the I/F circuit 311, the page buffer 120, and the control logic circuit 140 described with reference to FIG. 17 may be arranged in the peripheral circuit region PERI.

While the inventive concept has been particularly shown and described with reference to embodiments thereof, it will be understood that various changes in form and details may be made therein without departing from the spirit and scope of the following claims.

What is claimed is:

1. A memory device comprising:
   a memory cell array including a plurality of memory cells;
   a page buffer connected to the memory cell array;
   a control logic circuit configured to control an operation of the memory cell array;
   a plurality of input/output pins configured to respectively receive a plurality of data signals from a controller;
   a data bus inversion (DBI) pin configured to receive a DBI signal from the controller; and
   an interface circuit configured to count a first number of bits having a logic value of 1 and a second number of bits having a logic value of 0 from the plurality of data signals and the DBI signal and provide the plurality of data signals to the page buffer or the control logic circuit based on the first number of bits and the second number of bits.

2. The memory device of claim 1, wherein the interface circuit is further configured to:
   provide the plurality of data signals to the page buffer when the first number of bits is less than or equal to the second number of bits, and
   provide the plurality of data signals to the control logic circuit when the first number of bits is greater than the second number of bits.

3. The memory device of claim 1, wherein the interface circuit comprises a data signal decoder configured to receive the plurality of data signals from the plurality of input/output pins and receive the DBI signal from the DBI pin,
   the data signal decoder is further configured to determine that the plurality of data signals includes data when the first number of bits is less than or equal to the second number of bits, and
   the data signal decoder is further configured to determine that the plurality of data signals includes a command or an address when the first number of bits is greater than the second number of bits.

4. The memory device of claim 3, wherein the interface circuit further comprises a DBI decoder configured to generate decoded data by DBI decoding the data based on the DBI signal and provide the decoded data to the page buffer.

5. The memory device of claim 4, wherein the control logic circuit is further configured to control a write operation of the decoded data from the page buffer to the memory cell array based on the command and the address.

6. The memory device of claim 4, wherein the interface circuit further comprises:
   a plurality of data signal receivers respectively connected to the plurality of input/output pins; and
   a DBI signal receiver connected to the DBI pin, and
   the data signal decoder is further configured to receive the plurality of data signals from the plurality of data signal receivers and receive the DBI signal from the DBI signal receiver.

7. The memory device of claim 4, wherein the interface circuit further comprises:
   a plurality of data signal receivers respectively connected to the plurality of input/output pins; and
   a DBI signal receiver connected to the DBI pin, the data signal decoder is further configured to receive the plurality of data signals from the plurality of data signal receivers, and
   the DBI decoder is further configured to receive the DBI signal from the DBI signal receiver.

8. The memory device of claim 3, wherein, when the plurality of data signals includes the data, the DBI signal is at an enable level or a disable level according to the data, and,
   when the plurality of data signals includes the command or the address, the DBI signal is at the disable level.

9. The memory device of claim 3, wherein, when the plurality of data signals includes the data, the DBI signal is at a disable level, and,
   when the plurality of data signals includes the command or the address, the DBI signal is at an enable level.

10. The memory device of claim 3, wherein the control logic circuit comprises:
    a command decoder configured to receive the command from the interface circuit and decode the command; and
    an address decoder configured to receive the address from the interface circuit and decode the address.

11. A memory device comprising:
    a plurality of memory chips configured to receive a packet including a header and a data region from a controller, wherein each of the memory chips comprises:
    a plurality of input/output pads configured to respectively receive a plurality of data signals from the controller;
    a data bus inversion (DBI) pad configured to receive a DBI signal from the controller; and
    an interface circuit configured to count a first number of bits having a logic value of 1 and a second number of bits having a logic value of 0 from the plurality of data signals and the DBI signal and determine the plurality of data signals as the header or the data region based on the first number of bits and the second number of bits.

12. The memory device of claim 11, wherein the interface circuit is further configured to:
    determine that the plurality of data signals correspond to the data region when the first number of bits is less than or equal to the second number of bits, and
    determine that the plurality of data signals correspond to the header when the first number of bits is greater than the second number of bits.

13. The memory device of claim 11, wherein the packet further comprises a trailer, and
    the interface circuit is further configured to determine that the plurality of data signals correspond to the data region when the first number of bits is less than or equal to the second number of bits, and the interface circuit is further configured to determine that the plurality of data signals correspond to the header or the trailer when the first number of bits is greater than the second number of bits.

14. The memory device of claim 11, wherein the data region includes a command, an address, or data.

15. The memory device of claim 14, wherein each of the memory chips further comprises:
a memory cell array including a plurality of memory cells;
a page buffer connected to the memory cell array; and
a control logic circuit configured to control an operation of the memory cell array,
the interface circuit is further configured to determine the data region as the command, the address, or the data based on bits included in a first region of the header, and
the interface circuit is further configured to provide the data to the page buffer and provide the command or the address to the control logic circuit.

16. The memory device of claim 15, wherein the interface circuit is further configured to determine a selected memory chip from among the plurality of memory chips based on bits included in a second region of the header.

17. The memory device of claim 16, wherein the interface circuit comprises:
a header decoder configured to determine information included in the data region by decoding bits included in the first region of the header; and
a chip selection decoder configured to determine the selected memory chip by decoding bits included in the second region of the header.

18. The memory device of claim 15, wherein the interface circuit comprises:
a data signal decoder configured to determine that the plurality of data signals correspond to the data region when the first number of bits is less than or equal to the second number of bits and determine that the plurality of data signals correspond to the header when the first number of bits is greater than the second number of bits; and
a DBI decoder configured to generate a plurality of decoded data signals by DBI decoding the plurality of data signals corresponding to the data region based on the DBI signal.

19. The memory device of claim 11, further comprising a buffer chip configured to be connected between the controller and the plurality of memory chips,
wherein the buffer chip is configured to determine a selected memory chip from among the memory chips based on bits included in some regions of the header.

20. A memory device configured to receive a packet including a header and a data region from a controller, the memory device comprising:
a memory cell array including a plurality of memory cells;
a page buffer connected to the memory cell array;
a control logic circuit configured to control an operation of the memory cell array;
a plurality of input/output pins configured to respectively receive a plurality of data signals from the controller;
a data bus inversion (DBI) pin configured to receive a DBI signal from the controller; and
an interface circuit configured to count a first number of bits having a logic value of 1 and a second number of bits having a logic value of 0 from the plurality of data signals and the DBI signal, determine the plurality of data signals as the header or the data region based on the first number of bits and the second number of bits, determine the data region as data, a command, or an address based on bits included in the header, provide the data to the page buffer, and provide the command or the address to the control logic circuit.

* * * * *